US008330558B2

(12) United States Patent
Inoue et al.

(10) Patent No.: US 8,330,558 B2
(45) Date of Patent: Dec. 11, 2012

(54) FILTER AND ANTENNA DUPLEXER

(75) Inventors: Shogo Inoue, Kawasaki (JP); Tokihiro Nishihara, Kawasaki (JP); Takashi Matsuda, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 159 days.

(21) Appl. No.: 12/700,876

(22) Filed: Feb. 5, 2010

(65) Prior Publication Data
US 2010/0134203 A1 Jun. 3, 2010

Related U.S. Application Data

(62) Division of application No. 11/509,056, filed on Aug. 24, 2006, now Pat. No. 7,741,930.

(30) Foreign Application Priority Data

Aug. 25, 2005 (JP) ................. 2005-244644

(51) Int. Cl.
*H03H 9/00* (2006.01)
(52) U.S. Cl. .................... 333/195; 333/133; 333/193
(58) Field of Classification Search .............. 333/133, 333/193, 195, 219
See application file for complete search history.

(56) References Cited

U.S. PATENT DOCUMENTS

| | | | | |
|---|---|---|---|---|
| 5,933,062 A | * | 8/1999 | Kommrusch | 333/193 |
| 6,025,763 A | * | 2/2000 | Morimoto | 333/195 |
| 6,121,860 A | * | 9/2000 | Tsutsumi et al. | 333/195 |
| 6,369,674 B1 | * | 4/2002 | Matsumoto et al. | 333/195 |
| 6,437,667 B1 | | 8/2002 | Baeber et al. | |
| 6,469,598 B2 | | 10/2002 | Tsuzuki et al. | |
| 6,522,219 B2 | * | 2/2003 | Takamiya et al. | 333/133 |
| 6,650,207 B1 | * | 11/2003 | Tanaka | 333/195 |
| 6,911,881 B2 | * | 6/2005 | Tamazaki et al. | 333/195 |
| 6,995,631 B2 | | 2/2006 | Taniguchi | |
| 7,002,438 B2 | * | 2/2006 | Kawachi et al. | 333/195 |
| 7,190,241 B2 | * | 3/2007 | Ebata et al. | 333/193 |
| 2001/0008387 A1 | | 7/2001 | Taniguchi | |
| 2002/0036549 A1 | | 3/2002 | Matsuda et al. | |
| 2002/0153969 A1 | | 10/2002 | Inoue et al. | |
| 2002/0175783 A1 | | 11/2002 | Watanabe et al. | |
| 2003/0117039 A1 | | 6/2003 | Tsutsumi et al. | |
| 2003/0117240 A1 | | 6/2003 | Inoue et al. | |
| 2003/0214368 A1 | * | 11/2003 | Taniguchi | 333/133 |
| 2003/0214372 A1 | | 11/2003 | Miura et al. | |
| 2004/0021530 A1 | * | 2/2004 | Tamazaki et al. | 333/195 |
| 2004/0058664 A1 | * | 3/2004 | Yamamoto et al. | 455/339 |
| 2004/0075511 A1 | * | 4/2004 | Inoue et al. | 333/133 |

(Continued)

FOREIGN PATENT DOCUMENTS

CN 1518219 A 8/2004

(Continued)

OTHER PUBLICATIONS

Japanese Office Action dated Dec. 1, 2009, 9 pages.

*Primary Examiner* — Thienvu Tran
(74) *Attorney, Agent, or Firm* — Chen Yoshimura LLP

(57) ABSTRACT

There is provided a filter including a first resonator, a second resonator in which an excitation efficiency is reduced more than the first resonator, and an inductor connected in parallel with the second resonator.

3 Claims, 40 Drawing Sheets

U.S. PATENT DOCUMENTS

| | | | |
|---|---|---|---|
| 2004/0119561 A1* | 6/2004 | Omote | 333/133 |
| 2005/0035831 A1 | 2/2005 | Kawachi et al. | |
| 2005/0237129 A1 | 10/2005 | Kawamura | |
| 2005/0270124 A1* | 12/2005 | Ebata et al. | 333/193 |
| 2006/0139120 A1* | 6/2006 | Yamaguchi et al. | 333/133 |
| 2010/0134203 A1* | 6/2010 | Inoue et al. | 333/133 |

FOREIGN PATENT DOCUMENTS

| | | |
|---|---|---|
| EP | 0 949 756 A2 | 10/1999 |
| JP | 61-006917 A | 1/1986 |
| JP | 2002-176336 A | 6/2002 |
| JP | 2002-319842 A | 10/2002 |
| JP | 2002-353769 A | 12/2002 |
| JP | 2003-69382 A | 3/2003 |
| JP | 2003-163575 A | 6/2003 |
| JP | 2003-198317 A | 7/2003 |
| JP | 2003-332885 A | 11/2003 |
| JP | 2004-135322 A | 4/2004 |
| JP | 2004-242281 A | 8/2004 |
| JP | 2005-184143 A | 7/2005 |
| WO | WO 2004/047290 A1 | 6/2004 |
| WO | WO 2005/041403 A1 | 6/2005 |
| WO | WO-2005-060094 A1 | 6/2005 |

* cited by examiner

FIG. 1A
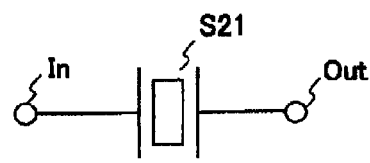
FIG. 1B
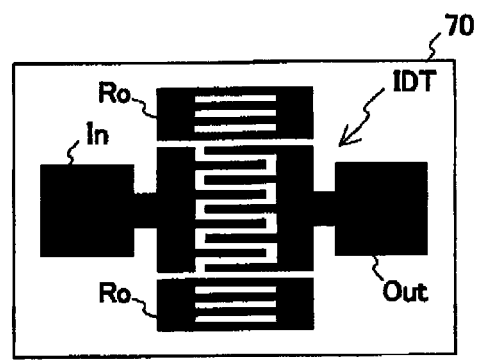
FIG. 1C
FIG. 1D
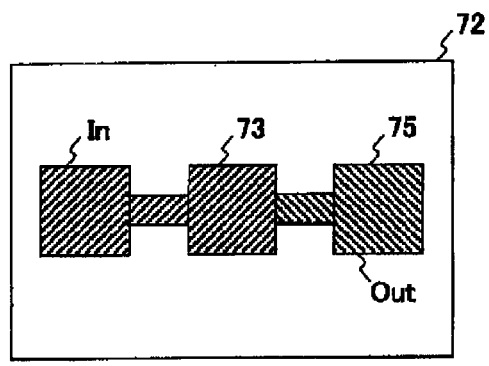
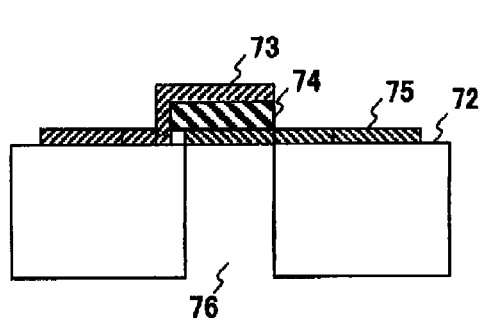

FIG. 7A
FIG. 7B
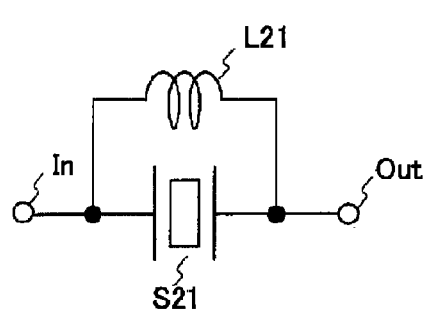
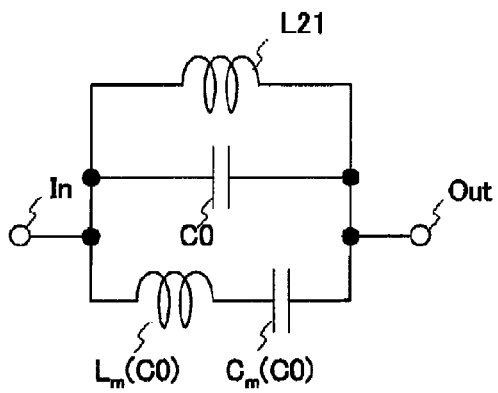
FIG. 7C
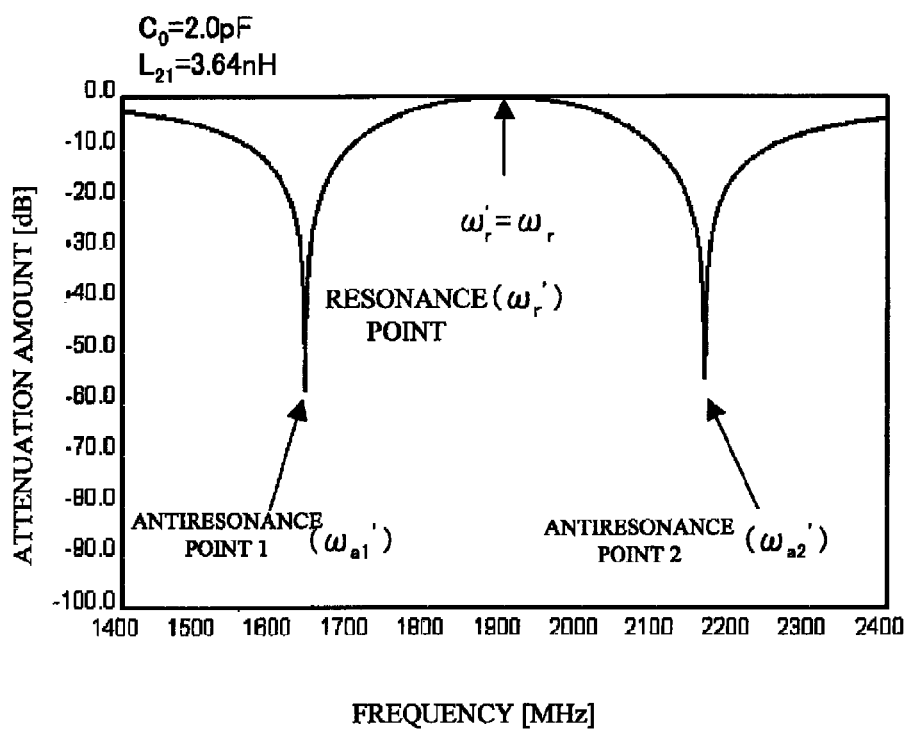

FILTER AND ANTENNA DUPLEXER

This is a Divisional Application, which claims the benefit of pending U.S. patent application Ser. No. 11/509,056 filed Aug. 24, 2006, which claims priority from Japanese Patent Application 2005-244644 filed Apr. 25, 2005. The disclosure of the prior application is hereby incorporated herein its entirety by reference.

BACKGROUND OF THE INVENTION

1. Field of the Invention

This invention generally relates to filters and antenna duplexers, and more particularly, to a filter and an antenna duplexer in which an inductor is connected in parallel with a resonator.

2. Description of the Related Art

In recent years, mobile telephones and mobile information terminals have become widespread rapidly, with the advancements of mobile communications systems. For example, the mobile telephone terminals communicate at high-frequency bands such as 800 MHz to 1.0 GHz and 1.5 GHz to 2.0 GHz. A device for the mobile communication system often employs a high-frequency filter having a resonator or antenna duplexer having the high-frequency filter.

Referring to FIG. 1A, a resonator S21 is arranged between an input terminal In and an output terminal Out to forms a one-port resonant circuit. A Surface Acoustic Wave (SAW) resonator or Film Bulk Acoustic Resonator (FBAR) is employed as a resonator. FIG. 1B is a top view of a SAW resonator. Mounted on a piezoelectric substrate 70 are: comb-like electrodes IDT (Interdigital Transducer) respectively connected to the input terminal In and the output terminal Out; and reflectors R0 provided at both sides of the comb-like electrodes IDT. The comb-like electrodes IDT and the reflectors R0 are made of a metal such as aluminum (Al), for example. Here, in the accompanying drawings, it is shown that the reflectors R0 and the IDT have electrode fingers less than the actual number of the fingers.

FIG. 1C is a top view of FBAR. FIG. 1D is a cross-sectional view thereof. A lower electrode 75, a piezoelectric film 74, and an upper electrode 73 are deposited on an opening 76 in a substrate 72 (an example is a silicon substrate). Aluminum nitride, for example, is used for the piezoelectric film 74. Instead of the opening 76, a multilayer reflection film is provided in some cases.

In the SAW resonator or FBAR, electrical energy that has been input is converted into elastic energy by a transducer, and the elastic energy is converted into the electrical energy again, so that the resonance phenomenon is obtained. For example, in the SAW resonator, the electrical energy input by the IDT is converted into a surface acoustic wave. The surface acoustic wave is converted into the electrical energy again by the IDT for output. In FBAR, the electrical energy input between the upper electrode and the lower electrode induces longitudinal mode thickness excitation (elastic wave). The elastic wave is again converted into the electrical energy by the upper electrode and the lower electrode. The efficiency that the electrical energy supplied to the transducer excites the elastic wave is known as excitation efficiency or conversion efficiency.

A ladder type filter, in which one-port resonant circuits are connected in series and in parallel, is used for a high-frequency filter. FIG. 2 shows a configuration of the ladder type filer. Between the input terminal In and the output terminal Out, series resonators S11 and S12 are connected in series and parallel resonators P11 and P12 are connected in parallel.

Referring to FIG. 3A through FIG. 4B, the operation principle of the ladder type filter will be described. The ladder type filter can be separated into series resonant circuits and parallel resonant circuits. Referring to FIG. 3A, in a series resonant circuit, assuming that a resonator S21 is a one-port resonant circuit, one of two signal terminals is set to the input terminal In and the other terminal is set to the output terminal Out. Referring to FIG. 3B, in a parallel resonant circuit, assuming that a resonator P21 is a one-port resonant circuit, one of the two signal terminals is connected to a ground terminal and the other terminal is connected to a short-circuit line.

FIG. 3C shows passband characteristic from the input terminal In to the output terminal Out of the series resonant circuit and parallel resonant circuit. The horizontal axis represents frequency, and the vertical axis represents band-pass amount. The passband characteristic of the series resonant circuit is indicated by a solid line, and that of the parallel resonant circuit is indicated by a dashed line. The passband characteristic of the series resonant circuit includes one resonance point (resonance frequency) $f_{rs}$ and one antiresonance point (antiresonance frequency) $f_{as}$. The passband amount is the highest at the one resonance point $f_{rs}$, and is the lowest at the one antiresonance point $f_{as}$. On the other hand, the passband characteristic of the parallel resonant circuit includes one resonance point $f_{rp}$ and one antiresonance point $f_{ap}$. The passband amount becomes the lowest at the one resonance point $f_{rp}$, and becomes the highest at the one antiresonance point $f_{ap}$.

FIG. 4A shows a structure of a one-stage ladder type filter. Referring to FIG. 4A, a series resonator S22 serving as a series resonant circuit is connected in series between the input terminal In and the output terminal Out, and a parallel resonator P22 serving as a parallel resonant circuit is connected between the output terminal Out and ground. At this point, it is designed that the resonance point $f_{rs}$ of the series resonant circuit is substantially identical to the antiresonance point $f_{ap}$ of the parallel resonant circuit. FIG. 4B shows passband characteristic from the input terminal In to the output terminal Out of the one-stage ladder type filter. The horizontal axis represents frequency, and the vertical axis represents band-pass amount. With the structure shown in FIG. 4A, the passband characteristic of the series resonant circuit and that of the parallel resonant circuit are combined, and the passband characteristic of FIG. 4B is obtainable. The band-pass amount is the highest around the resonance point $f_{rs}$ of the series resonant circuit and the antiresonance point $f_{ap}$ of the parallel resonant circuit, and is the lowest at the antiresonance point $f_{as}$ of the series resonant circuit and the resonance point $f_{rp}$ of the parallel resonant circuit. The passband is a frequency range that ranges from the resonance point $f_{rp}$ of the parallel resonant circuit to the antiresonance point $f_{ap}$ of the series resonant circuit, and the attenuation range is the frequency range equal to or lower than the resonance point $f_{rp}$ of the parallel resonant circuit and equal to or higher than the antiresonance point $f_{as}$ of the series resonant circuit. In this manner, the ladder type filer functions as a band-pass filter.

There has been proposed an antenna duplexer with the use of a filter having the above-described resonator. The antenna duplexer employs two band-pass filters to arrange a transmit filter between the transmitting terminal and the antenna terminal and arrange a receive filter between the receiving terminal and the antenna terminal. A matching circuit (for example, phase shifter) is also arranged between the antenna terminal and the transmit filter or between the antenna terminal and the receive filter. The antenna duplexer has functions of outputting a transmitting signal input from the transmitting terminal, from the antenna terminal, and outputting a received signal input from the antenna terminal, from the receiving terminal.

A description is given of the functions of the matching circuit in a case, for example, where the matching circuit is arranged between the antenna terminal and the receive filter. The matching circuit has functions of preventing the electricity of the transmitting signal input from the transmit terminal from entering the receive filter, and outputting the transmitting signal from the antenna terminal. Generally, the impedance equals almost zero at the receive filter in the frequency band of the transmitting signal. Therefore, a large part of the electricity of the transmitting signal enters the receive filter. So, the matching circuit is provided to convert the impedance in the frequency band of the transmitting signal at the receive filter into almost infinite. In this manner, the electricity of the transmitting signal can be prevented from entering the receive filter.

As disclosed in Japanese Patent Application Publication No. 2003-332885 (hereinafter, referred to as Patent document 1), Japanese Patent Application Publication No. 2003-69382 (hereinafter, referred to as Patent document 2), Japanese Patent Application Publication No. 2004-135322 (hereinafter, referred to as Patent document 3), and Japanese Patent Application Publication No. 2004-242281 (hereinafter, referred to as Patent document 4), there have been proposed the ladder type filters, in each of which an inductor is connected in parallel with a resonator. FIG. 5 shows a conventional filter according to the above-described conventional techniques. The series resonators S11 and S12 are connected in series between the input terminal In and the output terminal Out, and the parallel resonator P11 is connected between nodes of the resonators S11 and S12 and ground. The parallel resonator P12 is connected between the output terminal Out and ground. In addition, inductors L11 and L12 are respectively connected in parallel with the series resonators S11 and S12. With such configuration, two antiresonance points of the series resonant circuits are obtainable. Thus, with the use of the two antiresonance points, it is possible to provide a filter of excellent attenuation properties. Also, as disclosed in Japanese Patent Application Publication No. 2002-176336 (hereinafter, referred to as Patent document 5) and Japanese Patent Application Publication No. 2002-319842 (hereinafter, referred to as Patent document 6), there have been proposed the resonators that decrease the excitation efficiency of the SAW resonator.

The filter that includes a SAW resonator or FBAR serving as a resonator has similar functions (double resonance characteristic) having the resonance point and antiresonance point, which has been explained with reference to FIG. 3A through FIG. 4B. Herein, "resonator" simply denotes the resonator having the double resonance characteristic such as the SAW resonator or FBAR. Also, "resonant circuit (one-port resonant circuit)" denotes a circuit that includes a single resonator or a resonator with which an inductor or capacitor is connected in parallel. Herein, the code of a capacitor (an example is C0) is used as a capacitance of the capacitor. The code of an inductor is also used in a similar manner.

In the conventional techniques described in Patent Documents 1 through 4, however, the inductor connected in parallel with the resonator has a large size, thereby causing a problem that the sizes of the filter and the duplexer cannot be reduced. In addition, two antiresonance points cannot be arbitrarily set. For these reasons, there is another problem in that design flexibility is degraded in the filter that utilizes the two antiresonance points.

SUMMARY OF THE INVENTION

The present invention has been made in view of the above circumstances and provides a filter and an antenna duplexer that can be downsized or improve the design flexibility.

According to one aspect of the present invention, preferably, there is provided a filter including: a first resonator; a second resonator in which an excitation efficiency is reduced more than the first resonator; and an inductor connected in parallel with the second resonator. It is possible to reduce the mounting area and improve the attenuation of an arbitrary frequency. Accordingly, it is possible to provide a filter that can be downsized or improve the design flexibility.

According to another aspect of the present invention, preferably, there is provided a ladder type filter including: one or more series resonators; one or more parallel resonators; a first resonator; a second resonator in which an excitation efficiency is reduced more than the first resonator; and an inductor connected in parallel with the second resonator. At least one of the one or more series resonators and the one or more parallel resonators is the second resonator. Accordingly, it is possible to provide a ladder type filter of a small mounting area that can improve the attenuation at an arbitrary frequency.

According to another aspect of the present invention, preferably, there is provided a surface acoustic wave filter including: a multi-mode surface acoustic wave filter; a first resonator; a second resonator in which an excitation efficiency is reduced more than the first resonator; and an inductor connected in parallel with the second resonator. The first resonator and the second resonator are made of a piezoelectric thin film resonator or a piezoelectric thin film resonator. Accordingly, it is possible to provide a multi-mode surface acoustic filter of a small mounting area that can improve the attenuation at an arbitrary frequency.

According to another aspect of the present invention, preferably, there is provided an antenna duplexer including: an antenna terminal; a first filter and a second filter connected to the antenna terminal. At least one of the first filter and the second filter is a filter including: a first resonator; a second resonator in which an excitation efficiency is reduced more than the first resonator; and an inductor connected in parallel with the second resonator. Accordingly, it is possible to provide an antenna duplexer of a small mounting area that can improve the attenuation at an arbitrary frequency.

BRIEF DESCRIPTION OF THE DRAWINGS

Preferred exemplary embodiments of the present invention will be described in detail with reference to the following drawings, wherein:

FIG. 1A shows a resonator;
FIG. 1B is a top view of a SAW resonator;
FIG. 1C is a top view of FBAR;
FIG. 1D is a cross-sectional view of FBAR.

FIG. 7A shows a structure of a conventional resonant circuit;

FIG. 7B shows an equivalent circuit of the conventional resonant circuit;

FIG. 7C is a view showing the passband characteristic of the conventional resonant circuit;

DESCRIPTION OF THE PREFERRED EMBODIMENTS

Figure 2:
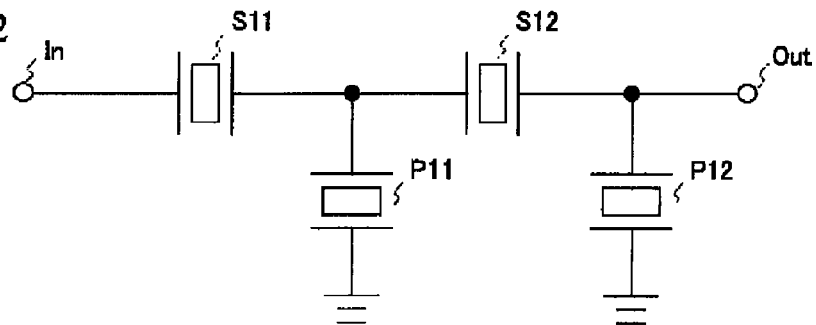
FIG. 2 shows a configuration of a ladder type filer.
Figure 3A:
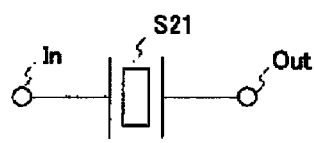
FIG. 3A shows a structure of a series resonant circuit.
Figure 3B:
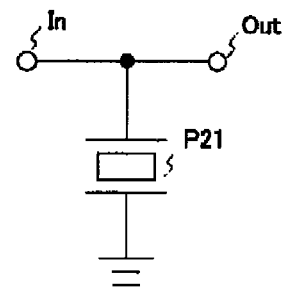
FIG. 3B shows a structure of a parallel resonant circuit.
Figure 3C:
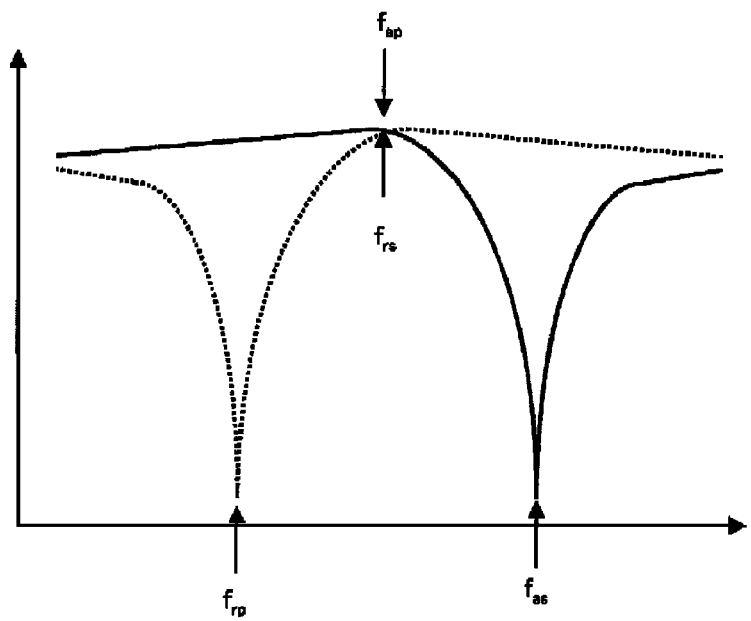
FIG. 3C shows passband characteristics of the series resonant circuit and parallel resonant circuit.
Figure 4A:
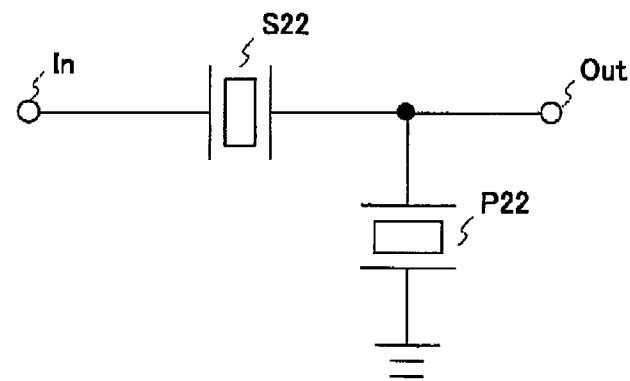
FIG. 4A shows a structure of a one-stage ladder type filter.
Figure 4B:
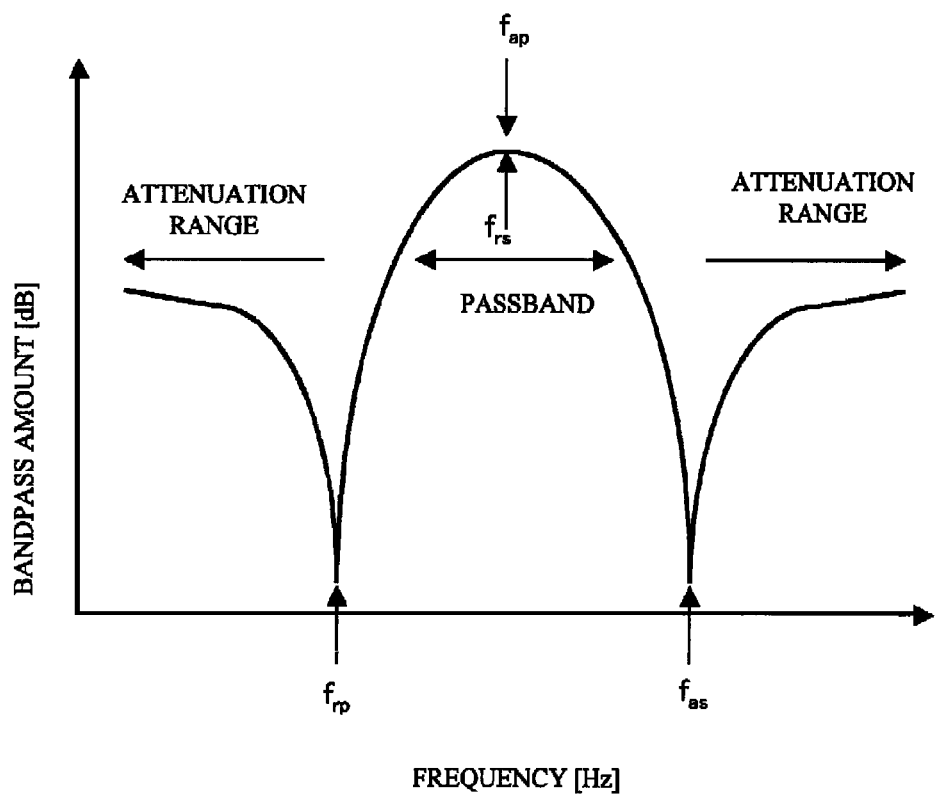
FIG. 4B shows passband characteristic of the one-stage ladder type filter.
Figure 5:
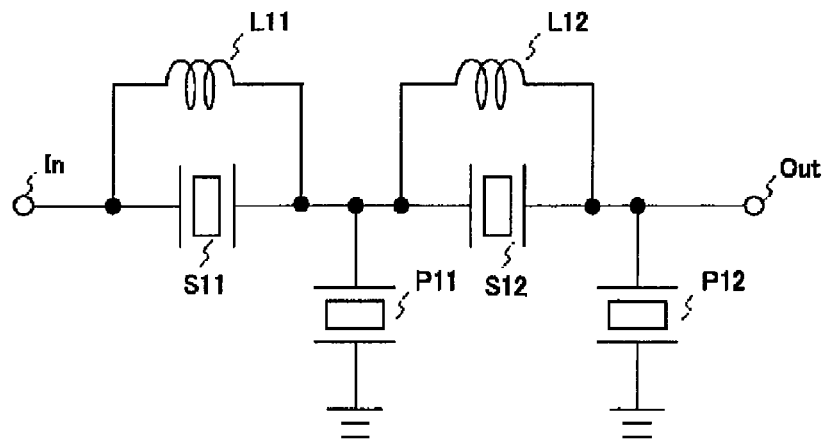
FIG. 5 shows a conventional filter.
Figure 6A:
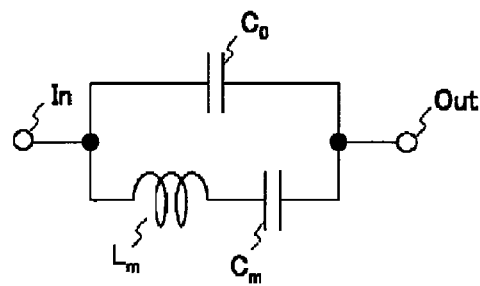
FIG. 6A shows an equivalent circuit of the resonator.

A description will first be given of a mechanism that can improve the attenuation characteristic, with the use of a conventional example. Firstly, a resonance point ωr and an antiresonance point ωa will be described. FIG. 6A is a view showing an equivalent circuit (double resonance model) of the resonator shown in FIG. 1A. Referring to FIG. 6A, a capacitance C0 of the resonator is connected in series with the input terminal In and the output terminal Out, and an inductance Lm connected in series with a capacitance Cm is connected in parallel with the capacitance C0. Here, the capacitance C0 corresponds to the capacitance generated at the IDT in the SAW resonator, and corresponds to the capacitance between the upper electrode and the lower electrode in the FBAR. Lm and Cm are parameters that determine the resonance frequency and the antiresonance frequency.

In the equivalent circuit of FIG. 6A, a resonance frequency fr denotes a frequency in which an impedance Z is zero between the input terminal In and the output terminal Out. In addition, the resonance angular frequency ωr=2πfr and the antiresonance angular frequency ωa=2πfa. The resonance angular frequency ωr and the antiresonance angular frequency ωa in Expression 1 are obtainable by solving Z=0 and Y=0.

$$\omega_r = \frac{1}{\sqrt{L_m C_m}}, \; \omega_a = \sqrt{\frac{1}{L_m C_m}\left(\frac{C_m + C_0}{C_0}\right)} \quad \text{(Expression 1)}$$

Here, assuming that the resonance angular frequency ωr and the antiresonance angular frequency ωa are fixed values. By solving Expression 1, Lm and Cm are represented as functions of C0 in Expression 2.

$$L_m(C_0) = \frac{1}{C_0(\omega_a^2 - \omega_r^2)}, \; C_m(C_0) = \frac{C_0(\omega_a^2 - \omega_r^2)}{\omega_r^2} \quad \text{(Expression 2)}$$

Figure 6B:
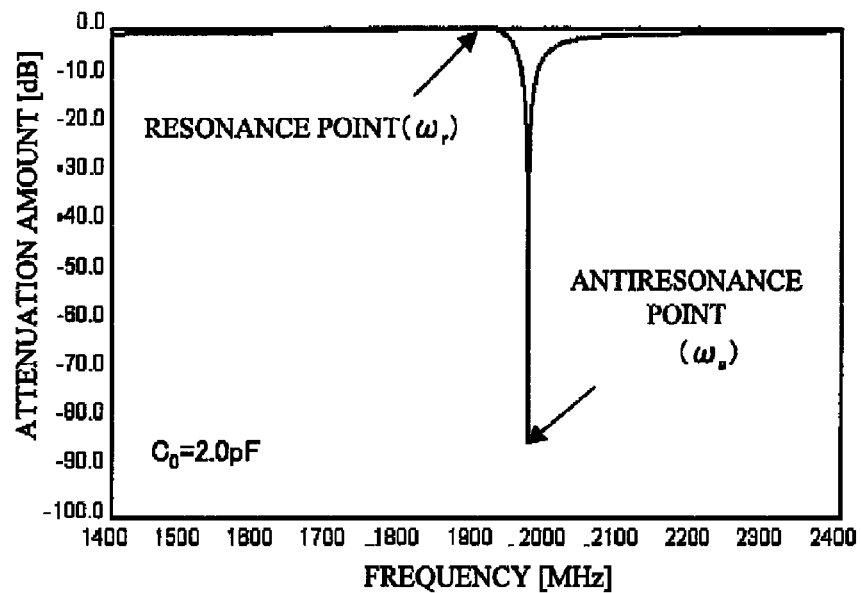
FIG. 6B shows passband characteristic of the resonator.

FIG. 6B is a view showing the attenuation with respect to the frequency of the resonator, which is calculated with the equivalent circuit shown in FIG. 6A and Expression 2. Here, the resonance frequency fr is set to 1900 MHz, the antiresonance frequency fa is set to 1970 MHz, and C0 is set to 2.0 pF. Referring to FIG. 6B, the attenuation is the lowest at the resonance point fr(ωr), and is the highest at the antiresonance point fa(ωa).

Next, a description will be given of a conventional example of the resonant circuit in which an inductor is connected in parallel with a resonator. FIG. 7A is a block diagram of the above-described resonator. FIG. 7B is an equivalent circuit thereof. Referring to FIG. 7A, the resonator S21 is arranged between the input terminal In and the output terminal Out and an inductor L21 is connected in parallel with the resonator S21. Referring to FIG. 7B, the inductance L21 is connected in parallel with the equivalent circuit of the resonator shown in FIG. 6A. With the use of the equivalent circuit, Expression 3 is obtainable when the resonance frequency ω'r is calculated and the impedance Z is zero. In this case, ω'r equals to the resonance angular frequency ωr of a singular resonator.

$$\omega'_r = \omega_r \quad \text{(Expression 3)}$$

Meanwhile, two antiresonance points, an antiresonance point 1 ω'a1 and an antiresonance point 2 ω'a2 are obtainable as shown in Expression 4 and Expression 5, by calculating the antiresonance angular frequency when an admittance Y is 0.

$$\omega'_{a1} = \sqrt{\frac{1 + C_0 L_{21}\omega_a^2 - \sqrt{(1 + C_0 L_{21}\omega_a^2)^2 - 4C_0 L_{21}\omega_r^2}}{2C_0 L_{21}}} \quad \text{(Expression 4)}$$

$$\omega'_{a2} = \sqrt{\frac{1 + C_0 L_{21}\omega_a^2 + \sqrt{(1 + C_0 L_{21}\omega_a^2)^2 - 4C_0 L_{21}\omega_r^2}}{2C_0 L_{21}}} \quad \text{(Expression 5)}$$

FIG. 7C is a view showing the attenuation, which is calculated by using the equivalent circuit of 7B, with respect to the frequency of the resonant circuit shown in FIG. 7A. Here, the resonance frequency fr is set to 1900 MHz, the antiresonance frequency fa is set to 1970 MHz, C0 is set to 2.0 pF, and L21 is set to 3.64 nH. Referring to FIG. 7C, the attenuation is the lowest at a resonance point f'r(ω'r), and is the highest at an antiresonance point 1 f'a1(ω'a1) and at an antiresonance point 2 f'a2(ω'a2). That is to say, the antiresonance point 1 f'a1 (ω'a1) and the antiresonance point 2 f'a2(ω'a2) are attenuation poles. In the ladder type filter having the resonant circuit in which a parallel inductor of Conventional Example is added, the attenuation characteristic of the filter is improved by using the antiresonance point 1 or the antiresonance point 2.

Figure 8:
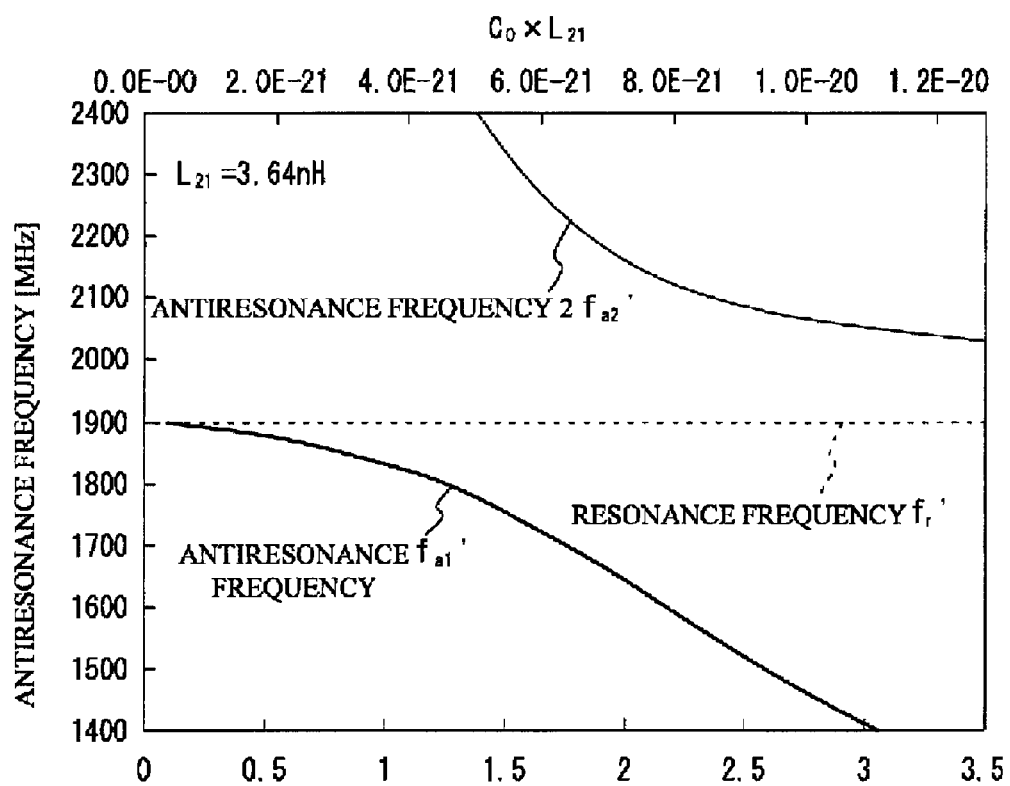
FIG. 8 is a view showing an antiresonance point and a resonance point of the conventional resonant circuit with respect to C0 and C0×L21.

With Expression 4 and Expression 5, the antiresonance point 1 ω'a1 and the antiresonance point 2 ω'a2 are determined by multiplication of C0 and L21. FIG. 8 is a view showing the antiresonance frequency f'a1 and the antiresonance point f'a2, where L21 is fixed at 3.64 nH, with respect to the capacitance C0 of the resonator S21. The horizontal axis denotes C0 and C0×L21, and the vertical axis denotes the antiresonance frequency and the resonance frequency. Referring to FIG. 8, the antiresonance frequencies f'a1 and f'a2 are uniquely determined by one parameter (C0×L21). Accordingly, in the filter designed with the use of the two antiresonance points (attenuation poles), if one of the antiresonance points is set to a desired frequency, the other antiresonance point cannot designed at a desired frequency value, thereby degrading the design flexibility.

First Exemplary Embodiment

A description will now be given of the configuration and principle of the resonant circuit employed in the first exemplary embodiment of the present invention. In a resonator, if the excitation efficiency of the resonator is reduced with the resonance frequency fixed, the resonance frequency does not change and only the antiresonance frequency is lowered. The reduced rate of the excitation efficiency is set to x %, an antiresonance frequency fa is expressed in Expression 6 with a resonance frequency fro and an antiresonance frequency fao, where x=0.

$$f_a = f_{a0} - x(f_{a0} - f_{r0})$$

Figure 9A:
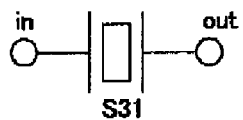
FIG. 9A is a block diagram of the resonator in which an excitation efficiency is reduced.
Figure 9B:
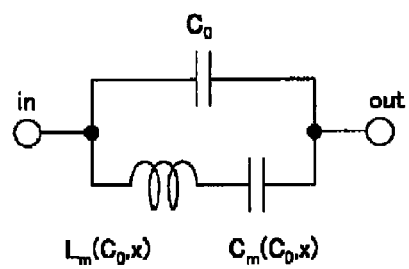
FIG. 9B is a view showing an equivalent circuit thereof.

A description will now be given of a case where the reduced rate x of the excitation efficiency is considered as a parameter in the resonant circuit shown in FIG. 6. FIG. 9A is a block diagram of a resonant circuit in which a resonator S31 which excitation efficiency is reduced is connected between the input terminal In and the output terminal Out. FIG. 9B is a view showing an equivalent circuit (double resonance model) of the resonator S31. As compared to the equivalent circuit of FIG. 6A, x is added as a parameter of Lm and Cm. Other configurations are same as those of FIG. 6A. Here, a resonance angular frequency ωr and an antiresonance angular frequency ωa are expressed in Expression 7, where a resonance angular frequency is ωro, an antiresonance angular frequency is ωao, and x=0.

$$\omega_r = \omega_{r0},\ \omega_a = \omega_{a0} - x(\omega_{a0} - \omega_{r0}) \quad \text{(Expression 7)}$$

Also, Lm and Cm are expressed in Expression 8, with the resonance angular frequency ωr and the antiresonance angular frequency ωa of Expression 7.

$$L_m(C_0, x) = \frac{1}{C_0(\omega_a^2 - \omega_r^2)}, \quad \text{(Expression 8)}$$

$$C_m(C_0, x) = \frac{C_0(\omega_a^2 - \omega_r^2)}{\omega_r^2}$$

Figure 9C:
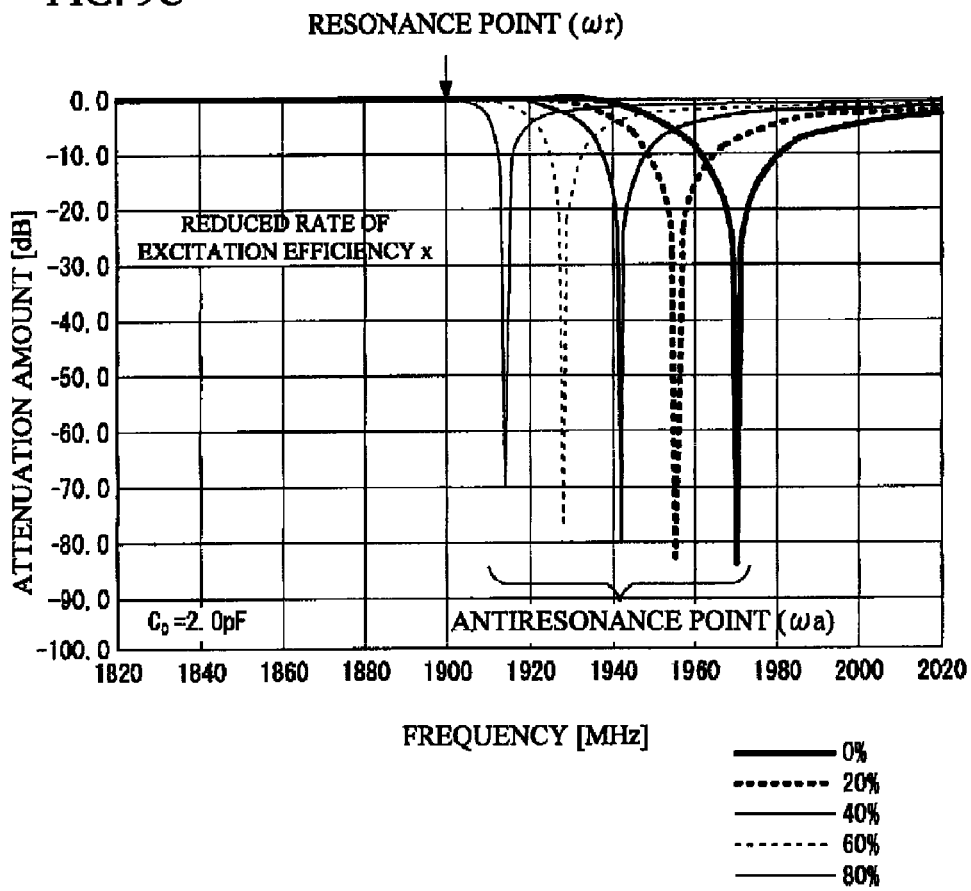
FIG. 9C is a view showing the passband characteristic thereof.

FIG. 9C shows the attenuation with respect to the frequency of the resonator calculated by using the equivalent circuit of FIG. 9B and Expression 7. Here, the resonance frequency fr is set to 1900 MHz, the antiresonance frequency fa is set to 1970 MHz, and C0 is set to 2.0 pF, where x is 0X. Calculations are carried out when x is 0%, 20%, 40%, 60%, and 80%. The curve is same as that shown in FIG. 6B, where x is 0%. As x becomes greater, the frequency of the antiresonance point fa (ωa) is lowered, although the frequency of the resonance point does not change.

Figure 10A:
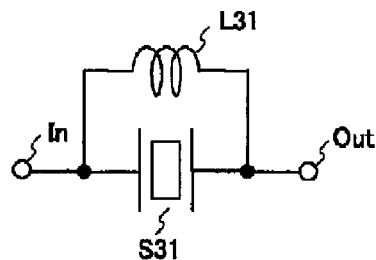
FIG. 10A is a block diagram of a resonant circuit in accordance with a first exemplary embodiment of the present invention.
Figure 10B:
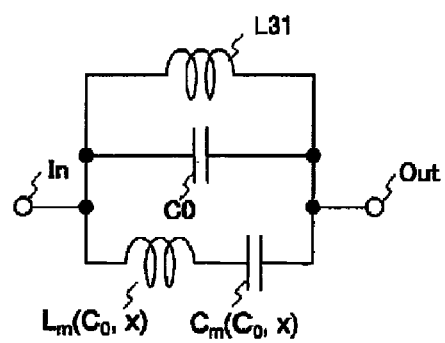
FIG. 10B is a view showing an equivalent circuit of the resonant circuit in accordance with the first embodiment of the present invention.

Next, a description will be given of the resonant circuit employed in the first exemplary embodiment, in which an inductor L31 is connected in parallel with the resonator S31 which excitation efficiency is reduced. FIG. 10A is a circuit diagram of a resonant circuit 18 employed in the first exemplary embodiment. Referring to FIG. 10A, the resonant circuit employed in the first exemplary embodiment is arranged between the input terminal In and the output terminal Out, and includes: the resonator S31 which excitation efficiency is reduced; and the inductor l31 connected in parallel with the resonator S31. FIG. 10B is an equivalent circuit (double resonance model) of the resonant circuit 18 employed in the first exemplary embodiment. An inductance l31 is connected in parallel with the equivalent circuit of the resonator shown in FIG. 9B. A resonance angular frequency ω"r, where an impedance of the resonant circuit 18 Z is 0, equals to the resonance angular frequency ωr of the resonator S31, as shown in Expression 10.

$$\omega''_r = \omega_r \quad \text{(Expression 9)}$$

Meanwhile, two antiresonance angular frequency, an antiresonance point 1 ω"a1 and an antiresonance point 2 ω"a2 are obtainable as shown in Expression 10 and Expression 11, when the antiresonance angular frequency in which an admittance Y is 0 is calculated.

$$\omega''_{a1} = \sqrt{\frac{1 + C_0 L_{31} \omega_a^2 - \sqrt{(1 + C L_{31} \omega_a^2)^2 - 4 C_0 L_{31} \omega_r^2}}{2 C_0 L_{31}}} \quad \text{(Expression 10)}$$

$$\omega'_{a2} = \sqrt{\frac{1 + C_0 L_{31} \omega_a^2 + \sqrt{(1 + C_0 L_{31} \omega_a^2)^2 - 4 C_0 L_{31} \omega_r^2}}{2 C_0 L_{31}}} \quad \text{(Expression 11)}$$

Figure 10C:
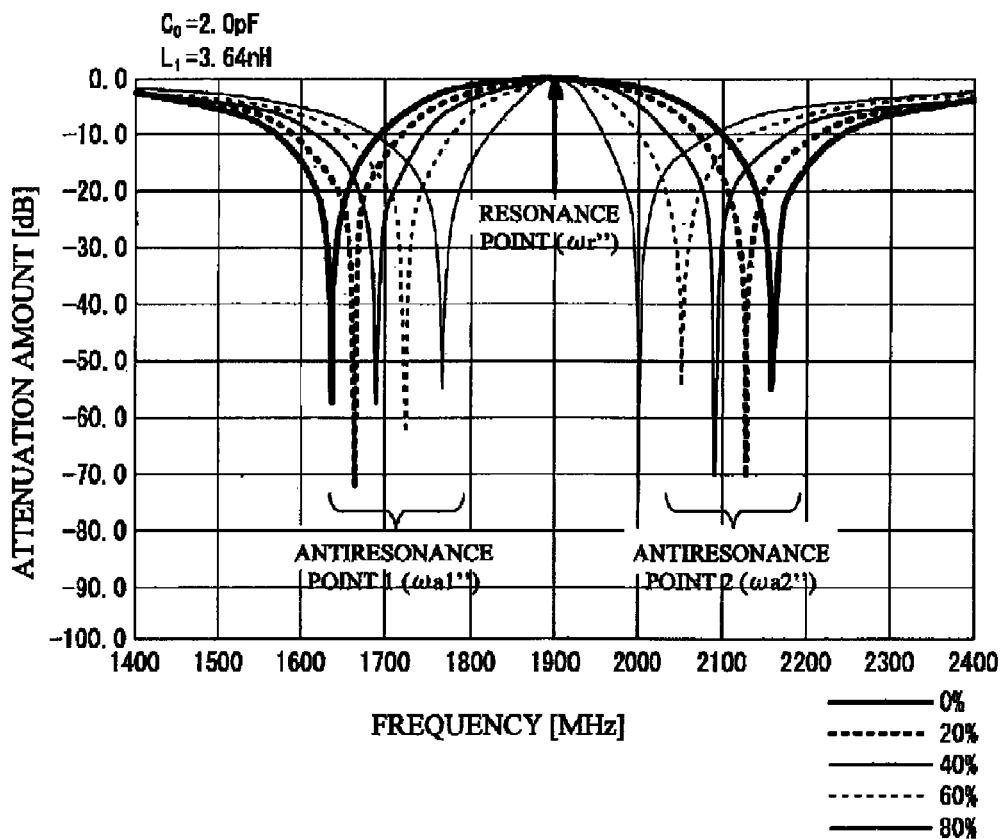
FIG. 10C shows passband characteristic of the resonant circuit in accordance with the first embodiment of the present invention.

FIG. 10C is a view showing the attenuation calculated by using the equivalent circuit of FIG. 10B with respect to the frequency of the resonant circuit employed in the first exemplary embodiment. Here, the resonance frequency fr is set to 1900 MHz, the antiresonance frequency fa is set to 1970 MHz, C0 is set to 2.0 pF, and L31 is set to 1.82 nH, where x is 0%. Calculations are carried out when x is 0%, 20%, 40%, 60%, and 80%. Referring to FIG. 10C, the attenuation is the lowest at the resonance point f"r (ω"r), and is the highest at an antiresonance point 1 f"a1(ω"a1) and an antiresonance point 2 f"a2(ω"a2). That is to say, attenuation poles are the antiresonance point 1 f"a1(ω"a1) and the antiresonance point 2 f"a2(ω"a2). Accordingly, similarly as the resonant circuits of Conventional Examples, the attenuation characteristic of the ladder type filter can be enhanced by using the antiresonance point 1 or the antiresonance point 2 in the resonant circuit employed in the first exemplary embodiment.

Figure 11:
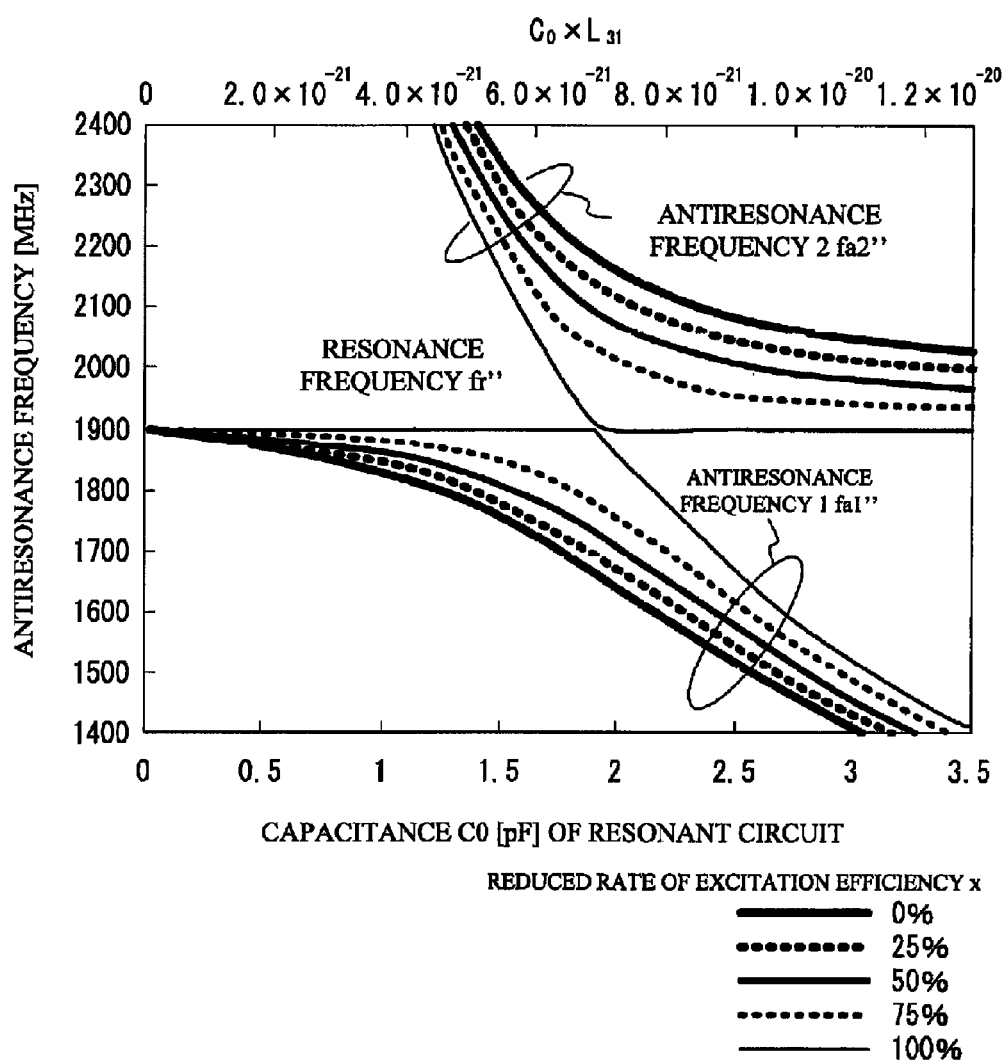
FIG. 11 is a view showing an antiresonance frequency and a resonance frequency of the resonant circuit with respect to C0 and C0×L21 in accordance with the first embodiment of the present invention.

FIG. 11 is a view showing the antiresonance frequencies 1 f"a1 and 2 f"a2 with respect to C0, when L31 is fixed to 3.64 nH and x % is changed from 0% to 80%. The horizontal axis represents C0 and C0×L31, and the vertical axis represents the antiresonance frequency and the resonance frequency. Referring to FIG. 11, the antiresonance frequencies 1 f"a1 and 2 f"a2 can be determined by parameters (C0×L31) and x. Therefore, two antiresonance points can be arbitrarily set. For example, in the filter designed with the use of the two antiresonance points (attenuation poles), two antiresonance points can be designed to be desired frequencies, thereby enhancing design flexibility. For example, if it is desired to suppress two different frequency bands, one antiresonance point and the other antiresonance point can be respectively set at the frequency bands that should be suppressed. Accordingly, two different frequency bands can be suppressed.

Figure 12A:
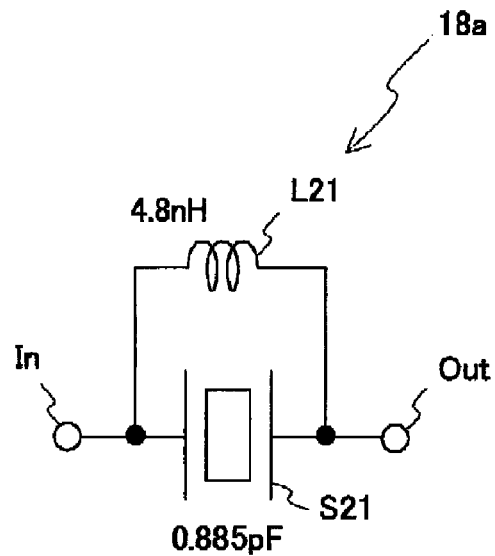
FIG. 12A shows a resonant circuit of Conventional Example 1.
Figure 12B:
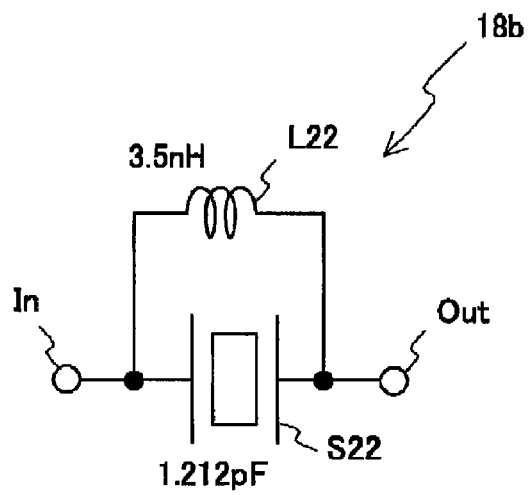
FIG. 12B shows a resonant circuit of Comparative Example 1.
Figure 12C:
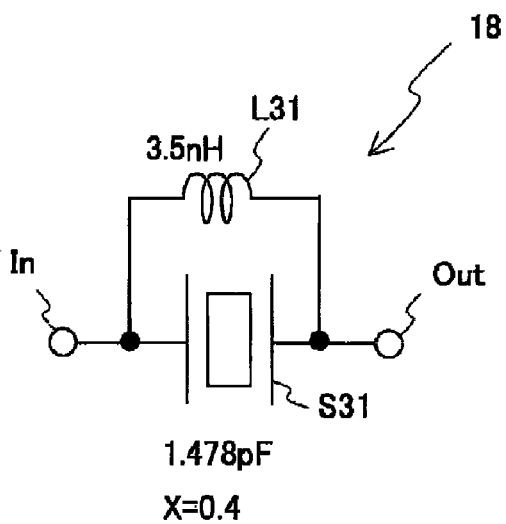
FIG. 12C shows a resonant circuit used in the first exemplary embodiment.

Next, a description will be given of the effect of the resonant circuit employed in the first exemplary embodiment, in a case where one (antiresonance point 1) of the two antiresonance points is used as an attenuation pole. FIG. 12A is a circuit diagram of a resonant circuit 18a of Conventional Example 1. FIG. 12B is a circuit diagram of a resonant circuit 18b of Comparative Example 1. FIG. 12C is a circuit diagram of a resonant circuit 18 employed in the first exemplary embodiment. Referring to FIG. 12A, the resonant circuit 18a of Conventional Example 1 is a resonant circuit in which the inductor L21 of 4.8 nH is connected in parallel with the resonator S21 having a capacitance of 0.885 pF. Referring to FIG. 12B, Comparative Example 1 is an example in which the capacitance of the resonator S22 is set to 1.212 pF and the inductance of an inductor L22 connected in parallel is set to 3.5 nH, to reduce the size of the inductor of the resonant circuit 18a. C0×L21 of Conventional Example 1 is substantially same as C0×L22 of Comparative Example 1. Accordingly, Conventional Example 1 and Comparative Example 1 substantially have same antiresonance point 1. Referring to FIG. 12C, the resonant circuit 18 employed in the first embodiment includes: a second resonator S31 in which the excitation efficiency is reduced; and the inductor L31 connected in parallel with the second resonator S31, in a different manner that a surface acoustic wave resonator having an IDT where electrode fingers of an identical width are alternately connected to two electrodes. The capacitance of the resonator S31 is set to 1.478 pF, the reduced rate x of the excitation efficiency is set to 40%, and the inductance of the inductor L31 is set to 3.5 nH, which is identical to that of Comparative Example 1. This makes the antiresonance point 1 same as that of Conventional Example 1.

Figure 13A:
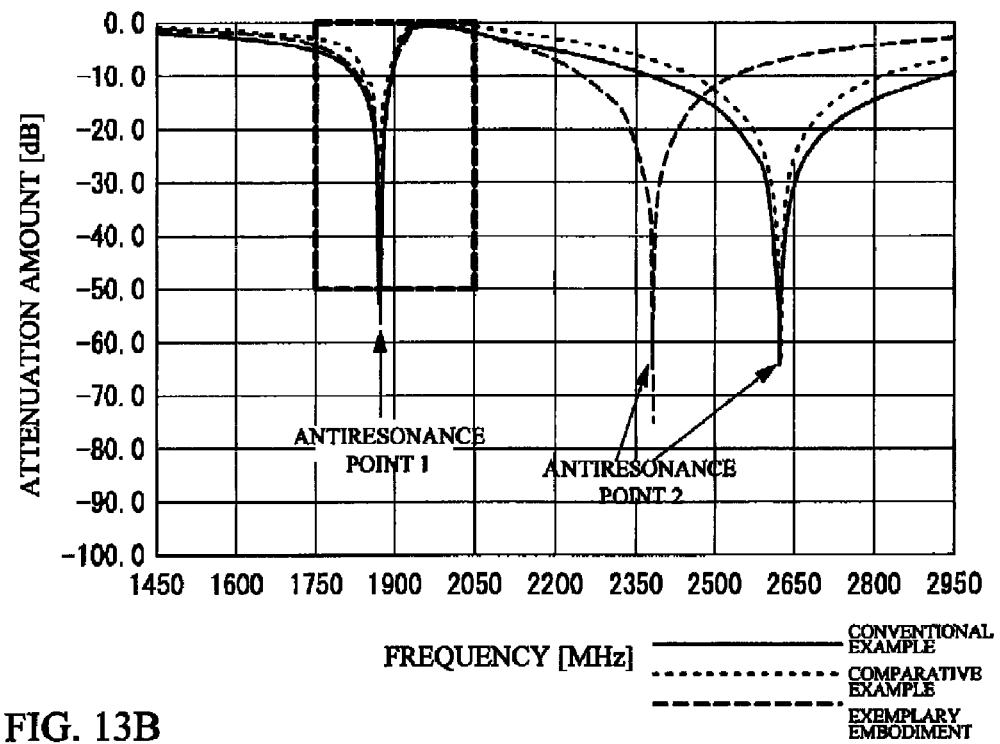
FIG. 13A shows passband characteristics of the resonators of Conventional Example 1, Comparative Example 1, and employed in the first embodiment of the present invention.
Figure 13B:
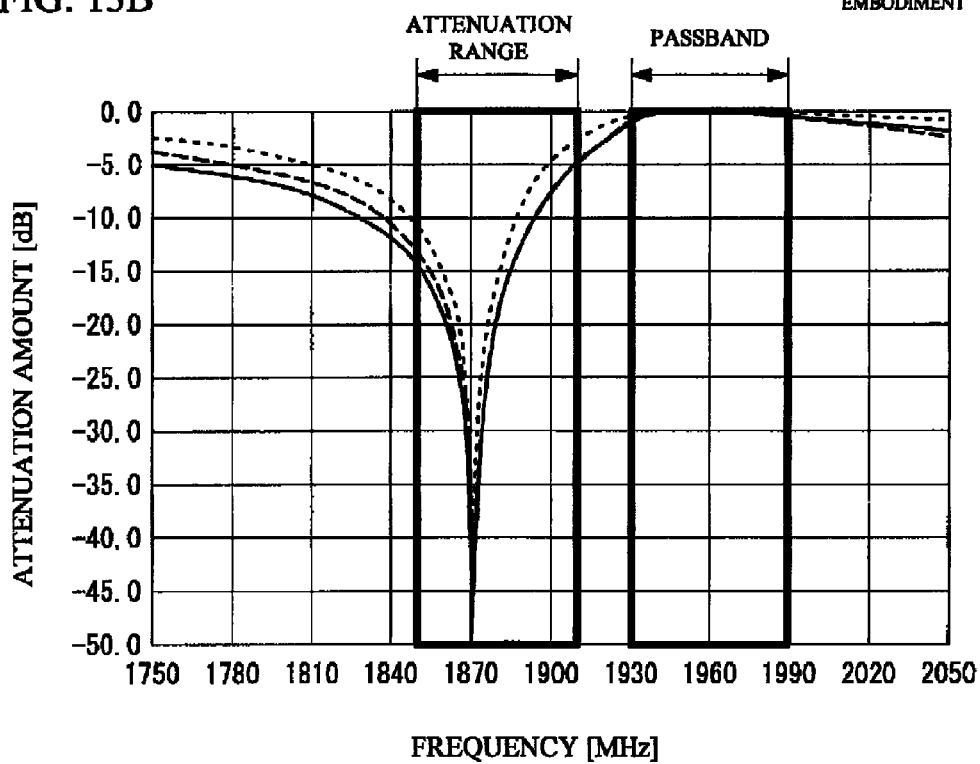
FIG. 13B is an enlarged view around an antiresonance point 1.

FIG. 13A is a view showing calculation results of the passband characteristic of the resonant circuit used in the above-described Conventional Example 1, in Comparative Example 1, and in the first embodiment. The horizontal line represents the frequency, and the vertical line represents the attenuation amount. FIG. 13B is an enlarged view around the antiresonance point 1 shown in FIG. 13A, and also shows an attenuation range and passband range that are demanded for the filter that includes the resonant circuit. Referring to FIG. 13A, the frequencies of the antiresonance points 1 in the three resonant circuits are almost the same. Referring to FIG. 13B, in such demanded attenuation range, Comparative Example 1 is smaller in the attenuation amount than Conventional Example 1, and is poor in the attenuation characteristic. Meanwhile, the curve of the first embodiment and that of Conventional Example 1 roughly overlap, and have similar attenuation characteristics.

An inductor demands a large area, making the mounting area therefor becomes larger. For this reason, the mounting area can be decreased by replacing the resonant circuit 18a of Conventional Example 1 with the resonant circuit 18b of Comparative Example 1 or the resonant circuit 18 employed in the first embodiment. The capacitance of the resonator S22 is made greater than that of Conventional Example 1, so that the antiresonance point of Comparative Example 1 is set equal to that of Conventional Example 1. Accordingly, as shown in FIG. 13B, the attenuation characteristic is degraded. However, the excitation efficiency of the resonant circuit 18 employed in the first exemplary embodiment is reduced more than that of Comparative Example 1, thereby making it possible to make the attenuation characteristic of the first embodiment almost equal to that of Conventional Example 1.

Hereinafter, a description will be given of a configuration that reduces the excitation efficiency of the resonator. For example, in the duplexers and filters, as will be described later in second through fourteenth embodiments, a first resonator denotes a standard resonator and a second resonator denotes a resonator, which is connected in parallel with an inductor and the excitation efficiency thereof is reduced more than that of the first resonator.

Figure 14A:
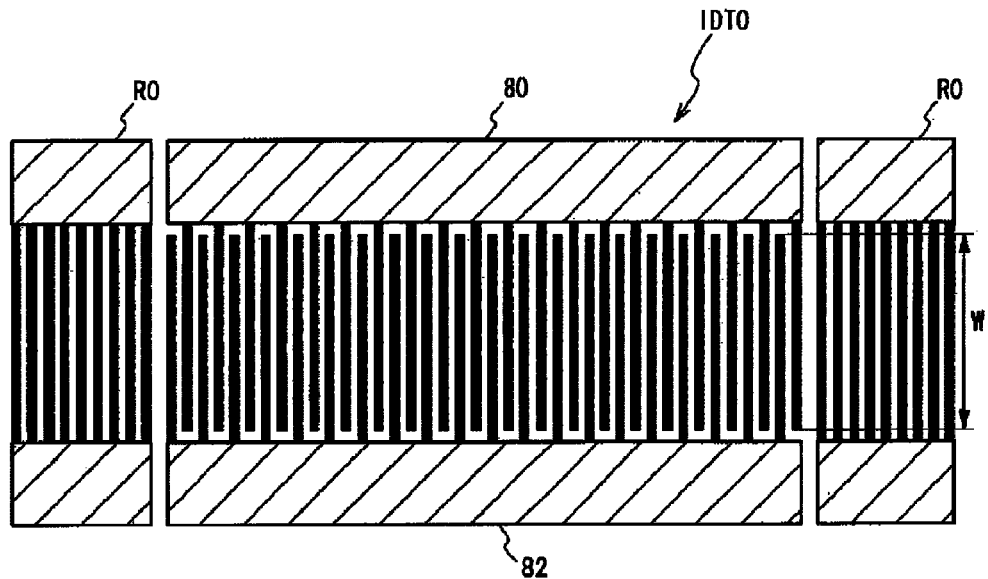
FIG. 14A is a top view of a normal resonator (resonator 0)
Figure 14B:
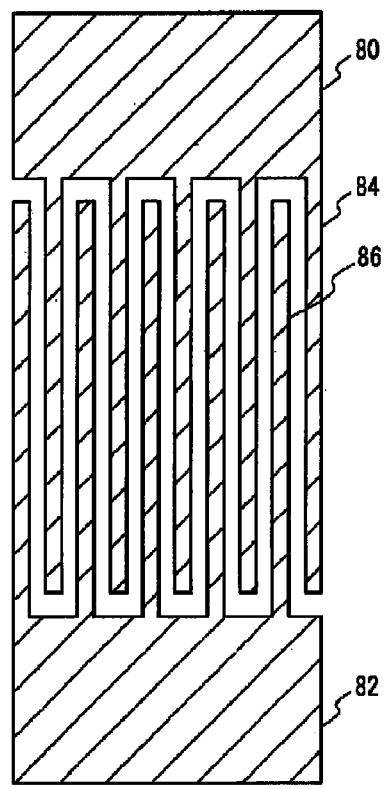
FIG. 14B is an enlarged view of electrode fingers.

Firstly, a description is given of a configuration in which the excitation efficiency of a SAW resonator is reduced. Normal resonator denotes a resonator in which all the electrode fingers have an identical width and are alternately connected to two electrodes of an IDT, and the excitation efficiency thereof is not intentionally reduced. FIG. 14A is a plan view of a resonator 0 of a normal resonator. FIG. 14B is an enlarged view around the electrode fingers. An interdigital transducer IDT 0 is arranged between two reflectors R0. The IDT 0 is composed of: an electrode 80 and an electrode 82. Electrode fingers 84 are connected to the electrode 80, and electrode fingers 86 are connected to the electrode 82. The electrode fingers 84 and 86 are alternately connected to the two electrodes 80 and 82 of the IDT. Each number of the electrode fingers 84 and 86 is 20, so there are 20 pairs of the electrode fingers (the number of the pairs in the IDT). The widths of the electrode fingers 84 and 86 are substantially equal to each gap between the electrode fingers 84 and 86. At this point, the excitation efficiency becomes the greatest. An aperture length w is a length where the electrodes fingers 84 and the electrode fingers 86 are crossed or interleaved. The capacitance C0 of the normal resonator is expressed in Expression 12, where w is the aperture length, n is the number of the pairs of the electrode fingers, $\in_0$ is a dielectric constant in vacuum, and $\in_r$ is a relative dielectric constant of a piezoelectric substrate.

$$C_0 = \in_0 \cdot \in_r \cdot w \cdot n \qquad \text{(Expression 12)}$$

Figure 15A:
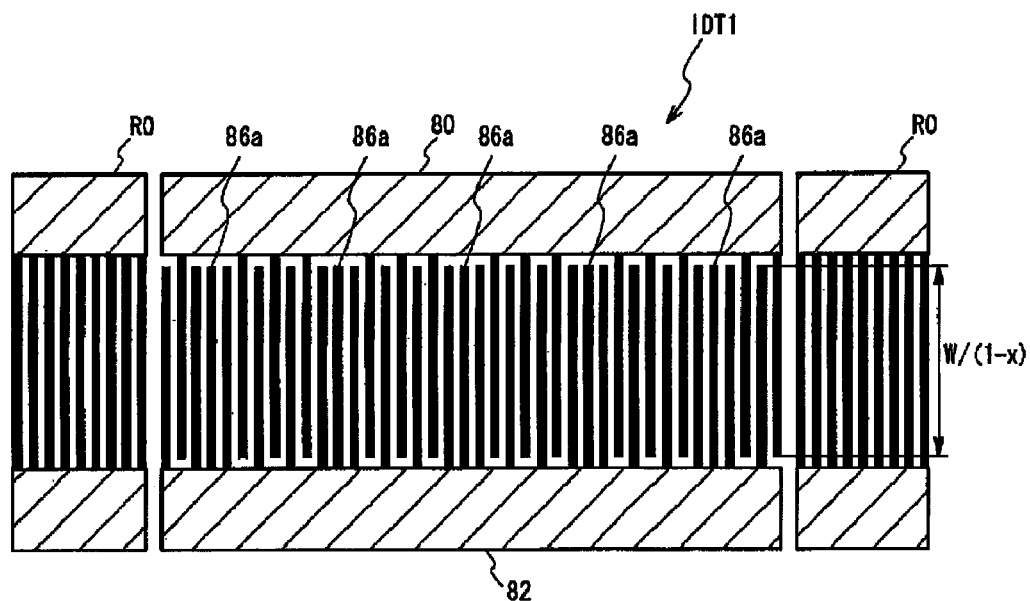
FIG. 15A is a top view of the resonator (resonator 1) in which the excitation efficiency is reduced.
Figure 15B:
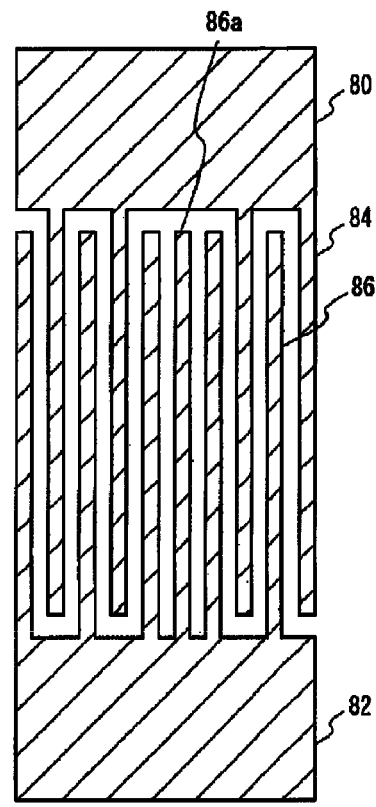
FIG. 15B is an enlarged view of the electrode fingers.

FIG. 15A is a plan view of the second resonator (resonator 1) in which at least one electrode finger is connected to an opposite side of the electrode, out of the electrode fingers alternately connected to two electrodes in the IDT. FIG. 15B is an enlarged view of FIG. 15A. In an interdigital transducer IDT 1 of the resonator 1, some of the electrode fingers 84 are connected to the opposite electrode 82 to become electrode fingers 86a. This is known as decimation, by which some of the electrodes are connected to the opposite polarity to the polarity that is supposed to be connected to in the normal resonator. On such decimated electrode fingers 86a, the surface acoustic wave is no longer excited, so the excitation efficiency of the resonator 1 becomes lower than that of the normal resonator (resonator 0). In FIG. 15A, there are five electrode fingers 86a. Therefore, a decimation rate is 25%, and the reduced rate x of the excitation efficiency is 25%. There is no capacitance produced in decimated electrode fingers 46a. Accordingly, the capacitance of the IDT 1 is $(1-x)$ times as much as that of the IDT 0. Expression 12 expresses the capacitance of the IDT. Preferably, the aperture length is corrected to be $w/(1-x)$, so that the capacitance of the resonator 1 equals that of the normal resonator. In addition, according to Expression 12, the capacitance may be matched with that of the normal resonator (resonator 0) by increasing the number of the pairs of the electrode fingers. However, if the number of the pairs of the electrode fingers is increased, the reduced rate x of the excitation efficiency is also changed. Therefore, it is preferable to adjust the aperture length.

Figure 16:
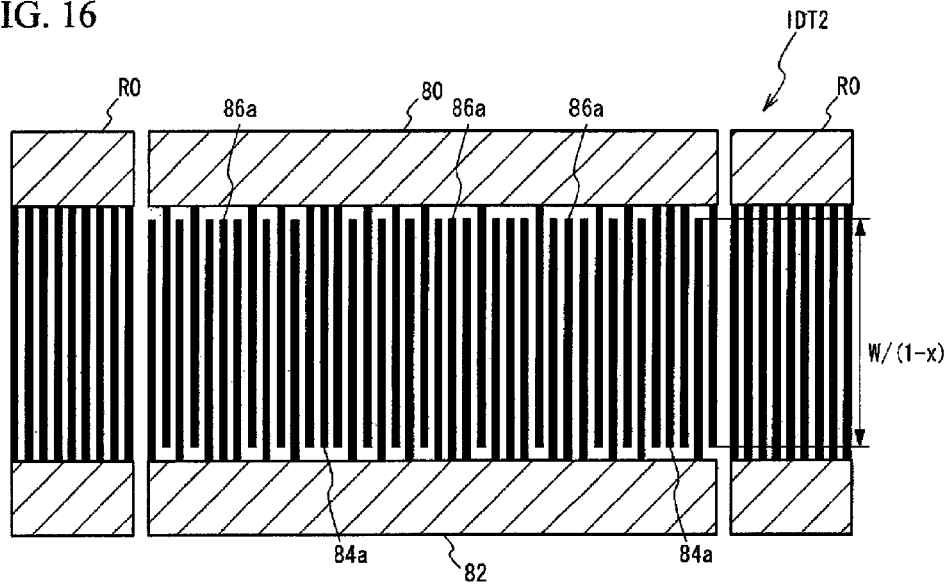
FIG. 16 is a top view of the resonator (resonator 2) in which the excitation efficiency is reduced.

FIG. 16 shows an example of the second resonator (resonator 2) having decimated electrode fingers in which the polarities of the electrode fingers are randomly changed. There are three electrode fingers 86a and two electrode fingers 84a, the polarities of which are changed in an interdigital transducer IDT 2. Preferably, x is 25% same as the resonator 1, and the aperture length is corrected to be $w/(1-x)$ same as the resonator 1. In the resonator 1, cyclic decimation leads to spurious response. The spurious response can be suppressed by random decimation of the electrode fingers as in the resonator 2.

Figure 17:
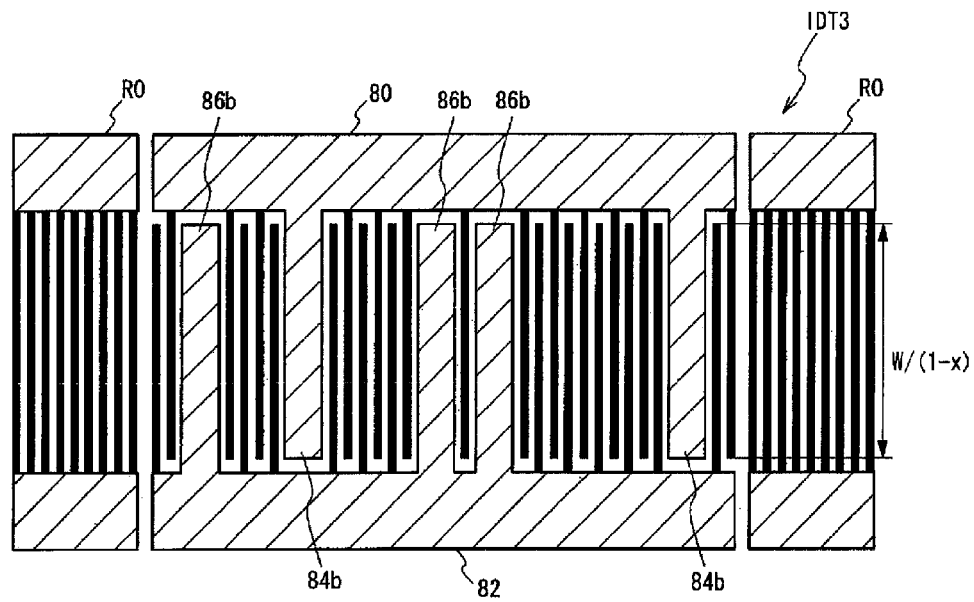
FIG. 17 is a top view of the resonator (resonator 3) in which the excitation efficiency is reduced.

FIG. 17 shows an example of the second resonator (resonator 3) in which there are provided electrode fingers 84b and 86b having the widths greater than those of the electrode fingers alternately connected to the two electrodes in the IDT. An interdigital transducer IDT 3 has the following decimated arrangement. That is, the IDT 3 includes electrode fingers 84b and 86b greater in width (sheet electrodes) respectively connected to the electrodes 80 and 82, the electrode fingers 84b and 86b respectively replacing adjacent three electrode fingers of identical polarities in the resonator 2 and being respectively connected to the electrodes 80 and 82. Also in the resonator 3, the surface acoustic wave is no longer excited on the electrode fingers 84b and 86b in a similar manner as the resonator 1 and resonator 2. There are five electrode fingers 84*b* and 86*b*, and *x* is 25%. Preferably, the aperture length is corrected to be w/(1−x) in a similar manner as the resonator 1 and the resonator 2. The spurious response can be suppressed by randomly providing the electrode fingers 84*b* and 86*b*, in a similar manner as the resonator 2.

Figure 18A:
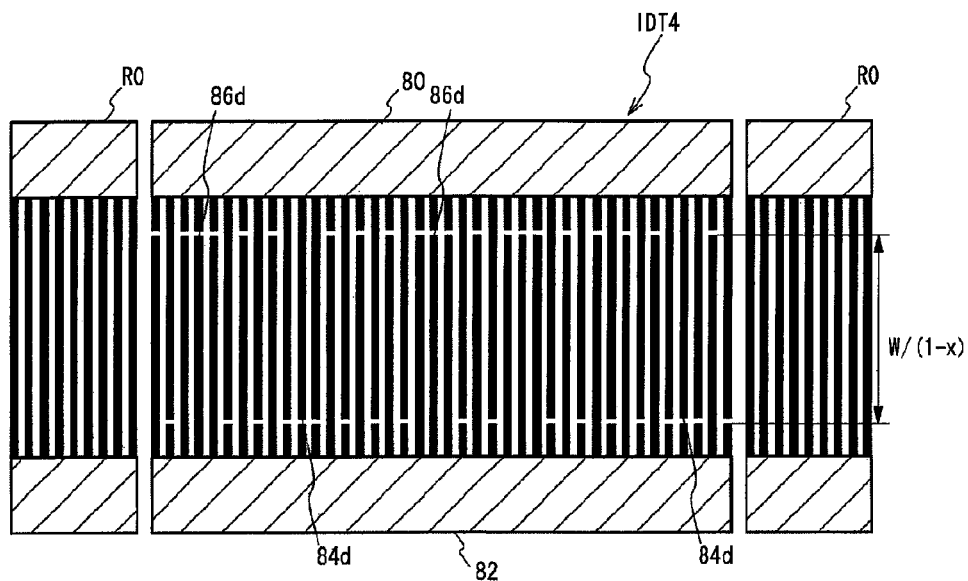
FIG. 18A is a top view of the resonator (resonator 4) in which the excitation efficiency is reduced.
Figure 18B:
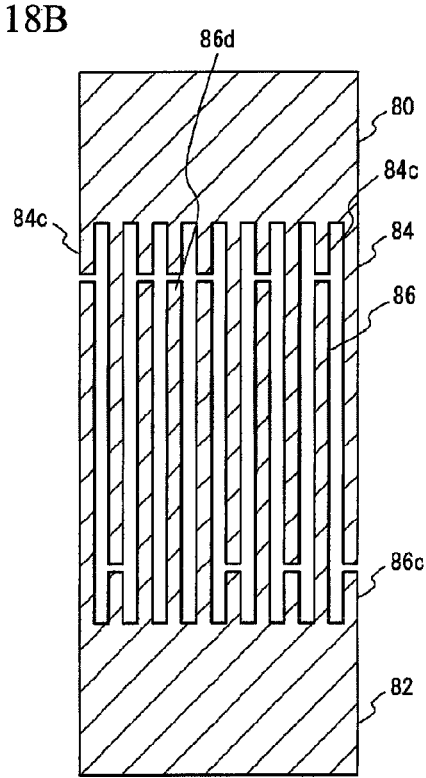
FIG. 18B is an enlarged view of the electrode fingers.

FIG. 18A is an example of the second resonator (resonator 4) in which there is provided an IDT having a dummy electrode that does not contribute to the excitation of the surface acoustic wave. FIG. 18B is an enlarged view thereof. An interdigital transducer IDT 4 includes electrode fingers 84*d* and 86*d* that are decimated in a similar manner as the resonator 2. In addition, the lengths of the electrode fingers are made shorter. There are provided dummy electrodes 86*c* at opposing sides of the ends of the electrode fingers 84 and 84*d*. The dummy electrodes 86*c* are connected to the electrode 80, and do not contribute to the excitation of the surface acoustic wave. There are also provided dummy electrodes 84*c* at opposing sides of the ends of the electrode fingers 86 and 86*d*. The dummy electrodes 84*c* are connected to the electrode 80, and do not contribute to the excitation of the surface acoustic wave. The dummy electrodes 84*c* and 86*c* make the IDT 4 a waveguide structure, thereby obtaining the resonator in which the leakage of the surface acoustic wave is suppressed and the insertion loss is low. The reduced rate x and the aperture length are corrected in a similar manner as the resonator 2. In addition, the dummy electrode may be provided in the first resonator in which the excitation efficiency is not reduced.

Figure 19A:
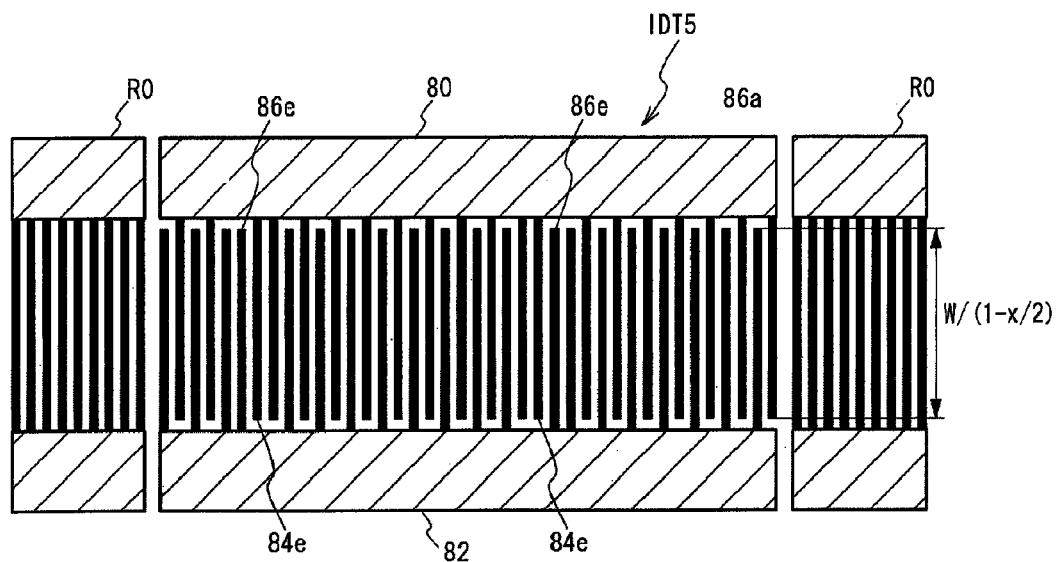
FIG. 19A is a top view of the resonator (resonator 5) in which the excitation efficiency is reduced.
Figure 19B:
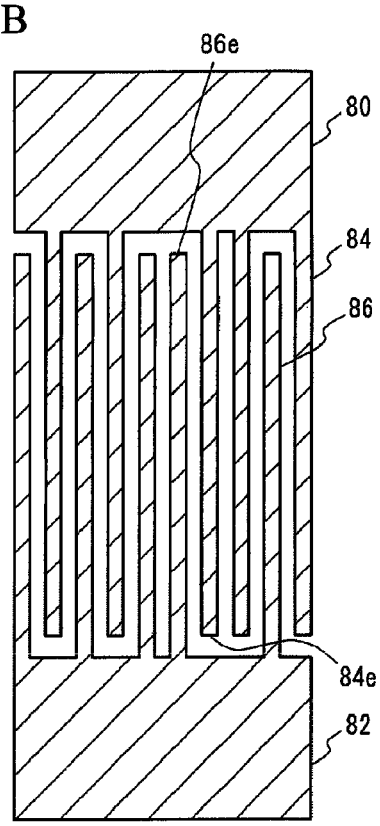
FIG. 19B is an enlarged view of the electrode fingers.

FIG. 19A is an example of the second resonator (resonator 5) in which at least two successive electrode fingers have reversed polarities. FIG. 19B is an enlarged view thereof. In an interdigital transducer IDT 5, two successive electrode fingers 86*e* and 84*e* randomly arranged are respectively connected to opposite electrodes 82 and 80, and have reversed polarities. On the electrode fingers 84*e* and 86*e* having such reversed polarities, surface acoustic waves are excited in such a manner that the phases thereof are different by 180 degrees with respect to the surface acoustic waves excited on other electrode fingers 84 and 86. For this reason, the surface acoustic waves excited on the electrode fingers 84*e* and 86*e* cancel those excited on the electrode fingers 84 and 86, thereby reducing the excitation efficiency. If there are provided a pair of the electrode fingers having reversed polarities, the reduced rate equals to the case where there are provided two pairs of the decimation electrodes. In the resonator 5, there are two pairs of the electrodes fingers 84*e* and 86*e* having the reversed polarities, 10% is the (reversed) rate of the reversed electrode fingers (two pairs) to all the pairs (20 pairs) of all the electrode fingers. Accordingly, the reduced rate x is 20% in the excitation efficiency. There is no capacitance at both sides of the reversed electrode fingers 84*e* and 86*e*, so the capacitance of the IDT 5 is (1−x/2) times as much as that of the IDT 0. Preferably, the aperture length is set to w/(1−x/2) so that the capacitance of the resonator 1 equals that of the normal resonator.

Figure 20:
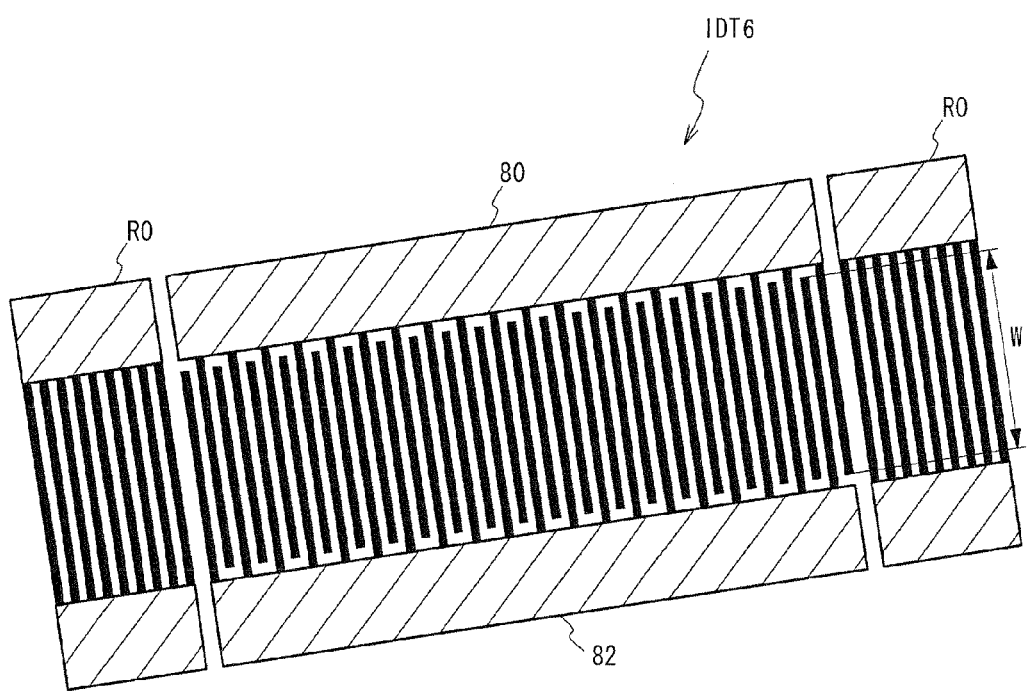
FIG. 20 is a top view of the resonator (resonator 6) in which the excitation efficiency is reduced.

FIG. 20 is an example of the second resonator (resonator 6) in which a propagation direction of the surface acoustic wave is different from that of the first resonator. The piezoelectric substrate has anisotropic characteristic, and the excitation efficiency is changed by the propagation direction of the surface acoustic wave. As shown in FIG. 20, the excitation efficiency can be reduced by changing the propagation direction of the surface acoustic wave, unlike the normal resonator in which the propagation direction of the surface acoustic wave is selected to increase the excitation efficiency. The capacitance of the resonator 6 is substantially same as that of the resonator 0, and it is preferable that the aperture length should be w.

Figure 21A:
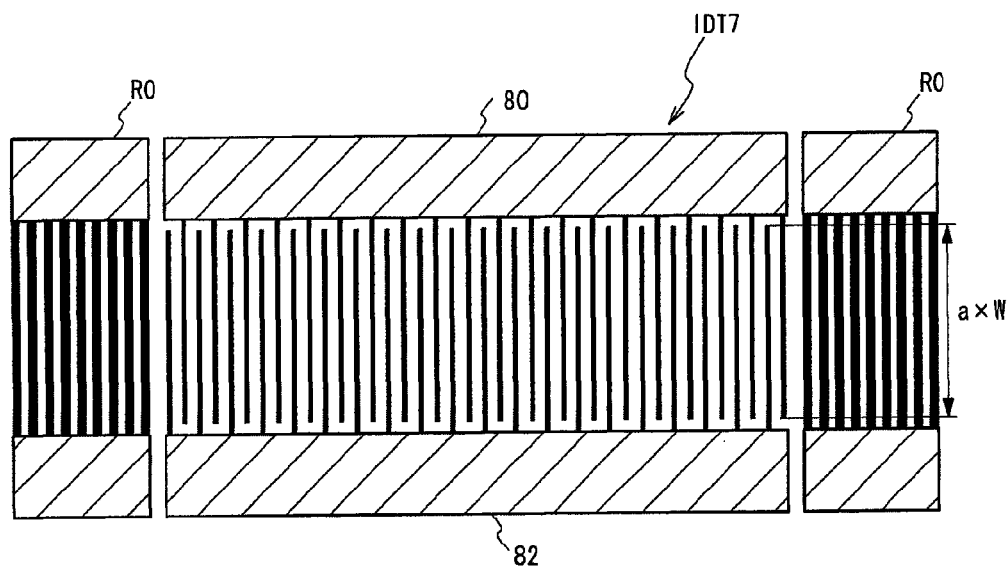
FIG. 21A is a top view of the resonator (resonator 7) in which the excitation efficiency is reduced.
Figure 21B:
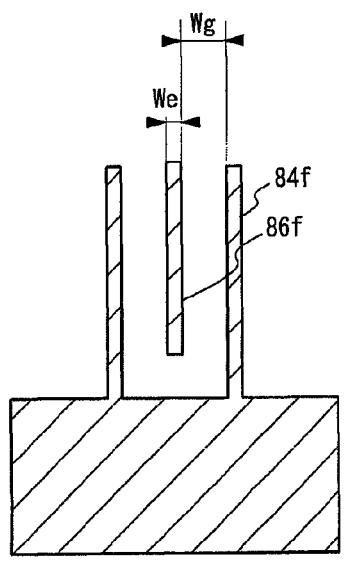
FIG. 21B is an enlarged view of the electrode fingers.

FIG. 21A is an example of the second resonator (resonator 7) in which the widths of the electrode fingers in the IDT are different from those of the first resonator. FIG. 21B is an enlarged view thereof. The excitation efficiency is the maximum, when We equals Wg, where We is the widths of electrode fingers 84*f* and 86*f* and Wg is a gap between the electrode fingers 84*f* and 86*f* in an interdigital transducer IDT 7. Accordingly, the excitation efficiency can be reduced by making We and Wg equal in the first resonator and differentiating the widths of the electrode fingers in the IDT of the resonator 7 from those of the electrode fingers in the IDT of the first resonator. The capacitance of the resonator 7 is varied by Wg. Accordingly, it is preferable that the aperture length should be a X w, where the reduced rate of the capacitance from the first resonator is set to 1/a.

Figure 22A:
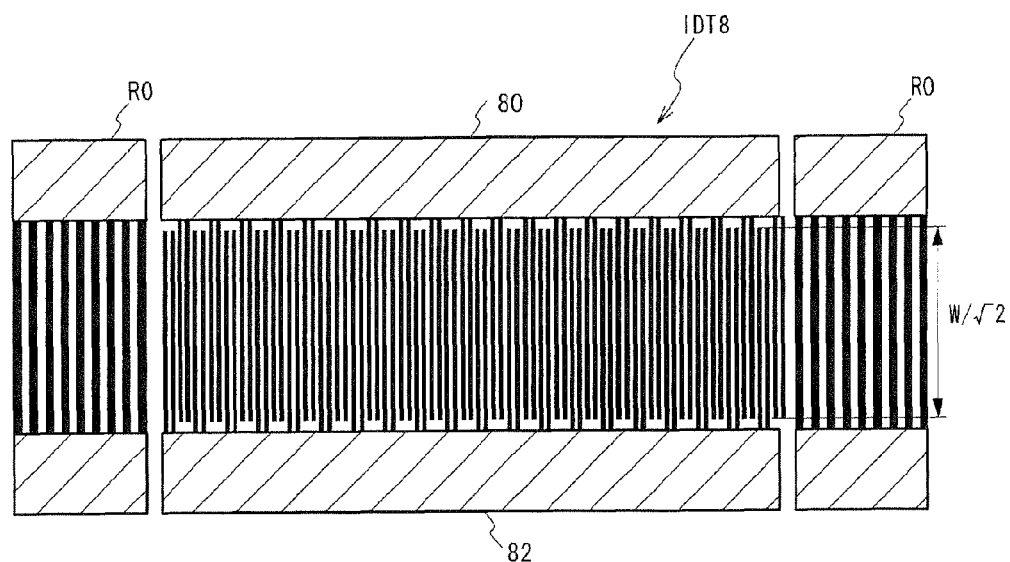
FIG. 22A is a top view of the resonator (resonator 8) in which the excitation efficiency is reduced.
Figure 22B:
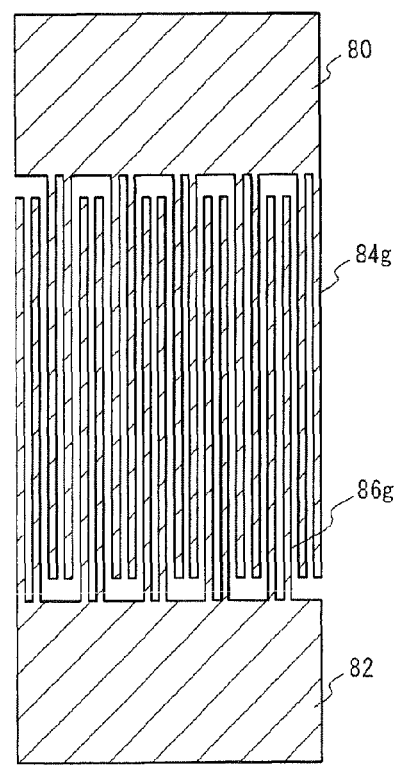
FIG. 22B is an enlarged view of the electrode fingers.

FIG. 22A is an example of the second resonator (resonator 8) in which every two electrode fingers are alternately connected to the two electrodes of the IDT. FIG. 22B is an enlarged view thereof. In an interdigital transducer IDT 8, the widths of electrode fingers 84*g* and 86*g* are half the normal resonator (resonator 0), and every two electrode fingers are respectively connected to the electrodes 80 and 82. Accordingly, there are provided four electrode fingers 84*g* and 86*g* in every cycle of the IDT in the resonator (double electrode), although there are provided two electrode fingers 84 and 86 in every cycle of the IDT in the normal resonator (single electrode). In the double electrode, the excitation efficiency can be reduced more than the single electrode. The capacitance of the double electrode is √2 of that of the single electrode. Accordingly, in the resonator 8, it is preferable that the aperture length should be set to w/√2. In this manner, the excitation efficiency can be reduced by respectively connecting every multiple electrode fingers to the two electrodes of the IDT in the second resonator.

Figure 23:
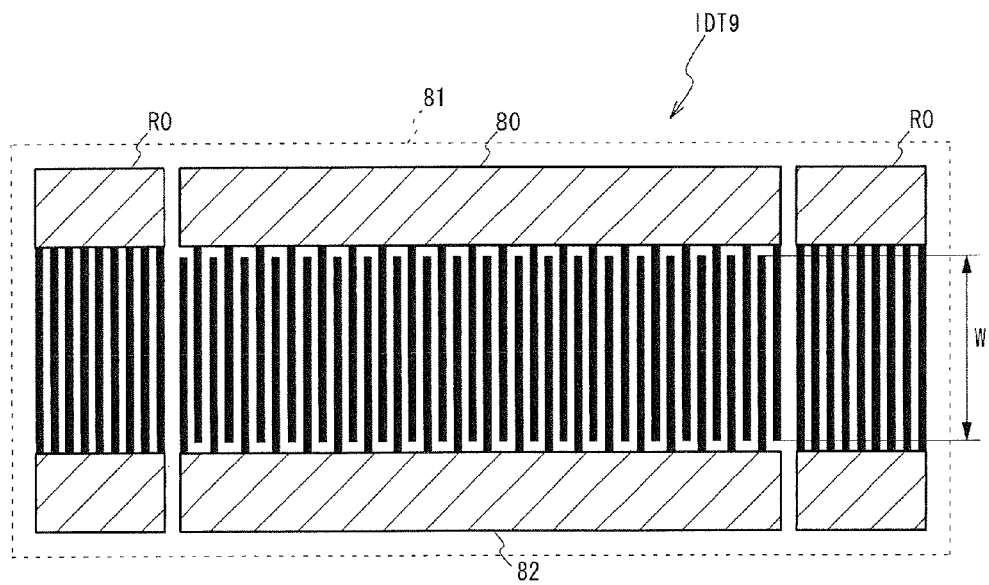
FIG. 23 is a top view of the resonator (resonator 9) in which the excitation efficiency is reduced.

FIG. 23 is an example of the second resonator (resonator 9) in which a dielectric film is provided on the resonator. In the resonator 9, a dielectric film 81 of, for example, a silicon oxide film is provided on the normal resonator shown in FIG. 14A. When the dielectric film is provided on a SAW resonator, the excitation efficiency of the resonator is reduced. In this manner, the resonator in which the excitation efficiency is reduced more than the first resonator is obtainable by providing the dielectric film thicker than the first resonator on the resonator. The capacitance of the resonator 9 substantially equals that of the resonator 0. Accordingly, it is preferable that the aperture length should be w.

Figure 24A:
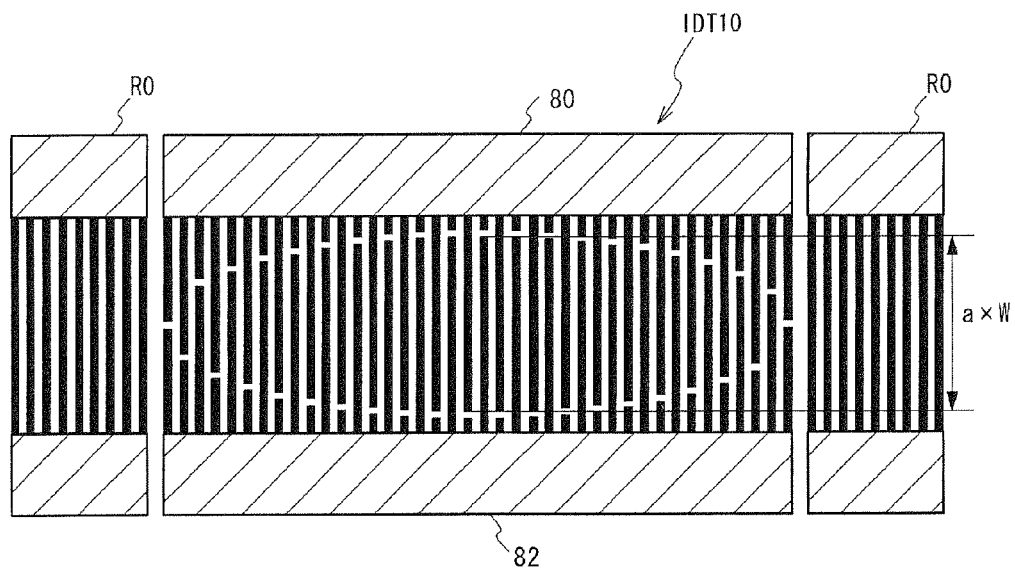
FIG. 24A is a top view of the resonator (resonator 10) in which the excitation efficiency is reduced.
Figure 24B:
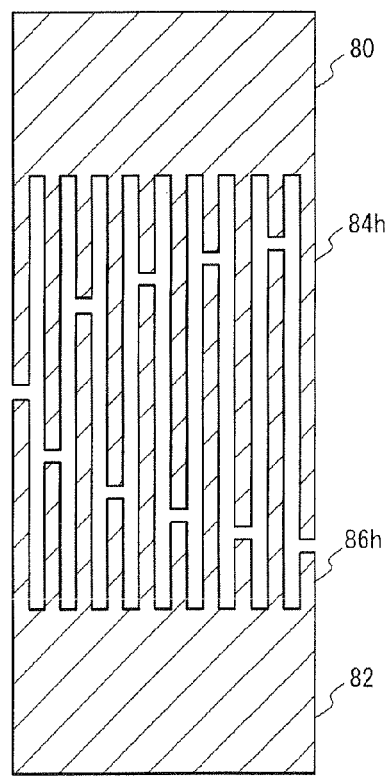
FIG. 24B is an enlarged view of the electrode fingers.

FIG. 24A is an example of the second resonator (resonator 10) in which the excitation efficiency is reduced by apotized weighting. FIG. 24B is an enlarged view thereof. The apotized weighting is a weighting method of changing crossed or interleaved widths of electrode fingers 84*h* and 86*h* of an interdigital transducer IDT 10 along the propagation direction of the surface acoustic wave. In accordance with the weighted shapes of the crossed or interleaved widths, the dummy electrode lengths (the electrode fingers 86*h* with respect to the electrode fingers 84*h*) also change along the propagation direction. When the apotized weighting is performed, the excitation efficiency is reduced according to the weighted shape. The capacitance of the IDT 10 is reduced by the apotized weighting. Accordingly, if 1/a is the reduced rate of the capacitance from that of the normal resonator, it is preferable that the aperture length should be a×w.

The excitation efficiency can be reduced by changing the thickness of the electrode film of aluminum that composes the resonator. As the thinner the electrode film is, the smaller the excitation efficiency becomes. Therefore, the excitation efficiency of the second resonator can be reduced by making the electrode film of the first resonator thinner than that of the second resonator (resonator 11).

As described heretofore, the second resonator has been described as an example where the excitation efficiency of the surface acoustic wave resonator is reduced. However, the present invention is not limited thereto. Arbitrary configuration may be employed, if the excitation efficiency is reduced in the configuration. In addition, the resonator 1 through the resonator 11 may be combined arbitrarily.

Figure 25A:
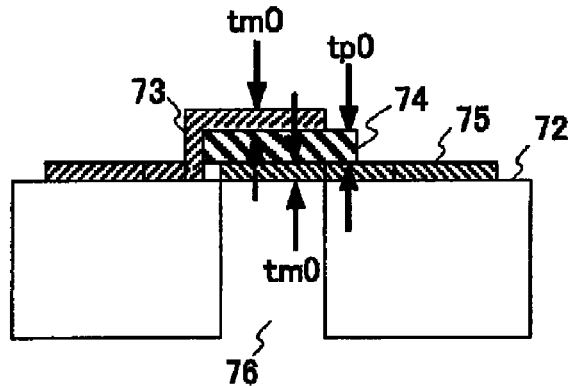
FIG. 25A is a cross-sectional view of a first resonator (resonator 00)
Figure 25B:
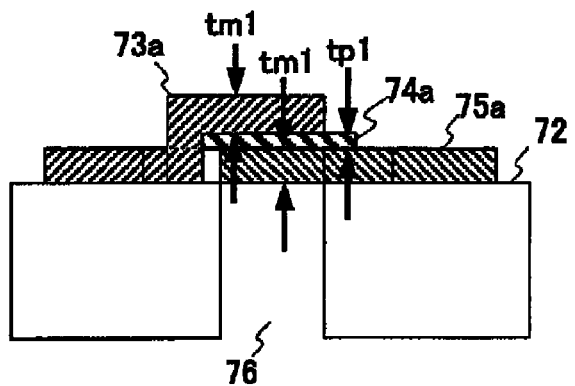
FIG. 25B is a cross-sectional view of a first resonator (resonator 00) in which the excitation efficiency is reduced.
Figure 25C:
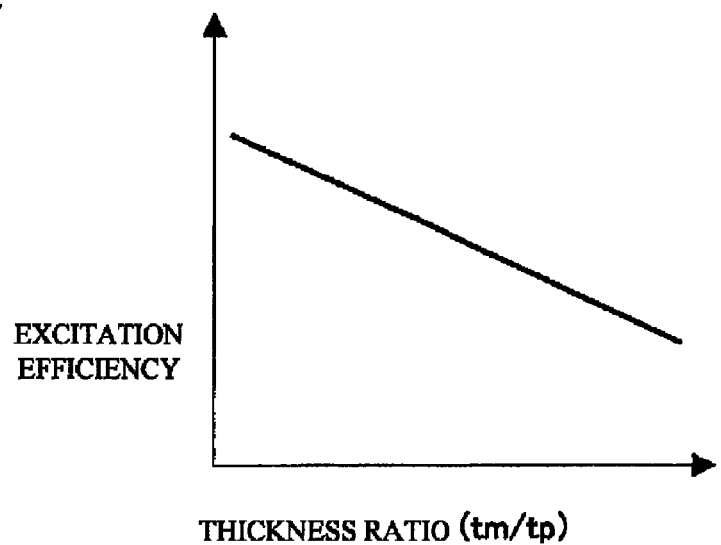
FIG. 25C shows the excitation efficiency with respect to a film thickness.

Next, a description will be given of a configuration that reduces the excitation efficiency of FBAR. FIG. 25A is a cross-sectional view of a standard FBAR (resonator 00). The configuration is same as that of FIG. 1D, the same components and configurations as those of FIG. 1D have the same reference numerals and a detailed explanation will be omitted. The resonator 00 includes: an upper electrode film 73 and a lower electrode film 75, both of which have a thickness of tm0; and a piezoelectric film 74 having a thickness tp0. FIG. 25B is a cross-sectional view of a resonator 01 in which the excitation efficiency is reduced more than that of the resonator 00. In the resonator 01, except that each film thickness is different, the same components and configurations as those of FIG. 25A have the same reference numerals and a detailed explanation will be omitted. In a resonator 01, a thickness tm1 of the upper electrode film 73 and a lower electrode film 75a is thicker than tm0, and a thickness tp1 of a piezoelectric film 74a is thinner than tp0. FIG. 25C is a view showing a thickness ratio (tm/tp) and the excitation efficiency, where tm is the thickness of the upper electrode film 73 and the lower electrode film 75 and tp is a thickness of the piezoelectric film. As the thickness ratio (tm/tp) is increased, the excitation efficiency is reduced. Accordingly, the excitation efficiency of the second resonator can be reduced more than that of the first resonator, by making the thickness ratio of the piezoelectric film 74 to the upper electrode film 73 and that of the piezoelectric film 74 to the lower electrode film 75 in the second resonator smaller than the thickness ratio of the piezoelectric film to the corresponding upper electrode film or the lower electrode film in the first resonator.

The excitation efficiency of the second resonator can be reduced more than that of the first resonator, by making at least one of the thickness of the upper electrode film 73 and the lower electrode film 75 in the second resonator thicker than the thickness of the corresponding upper electrode film 73 or the lower electrode film 75 in the first resonator. In addition, the excitation efficiency of the second resonator can be reduced more than that of the first resonator, by making the thickness of the piezoelectric film 74 in the second resonator thinner than that of the piezoelectric film in the first resonator.

Figure 26A:
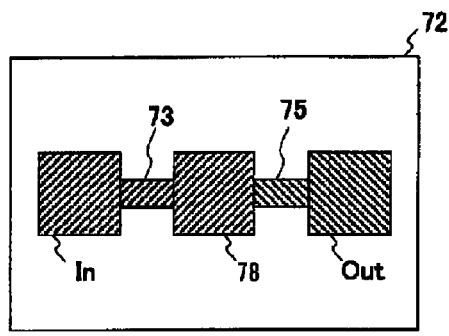
FIG. 26A is a top view of the first resonator (resonator 00)
Figure 26B:
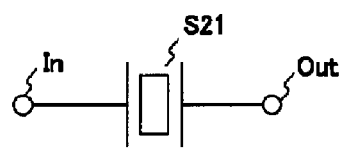
FIG. 26B is a circuit diagram thereof.
Figure 26C:
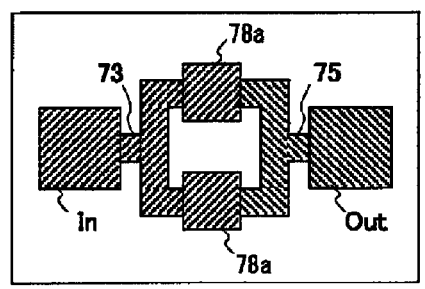
FIG. 26C is a top view of the resonator (resonator 02) in which the excitation efficiency is reduced.
Figure 26D:
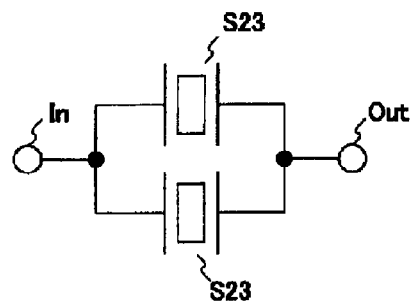
FIG. 26D is a circuit diagram thereof.
Figure 26E:
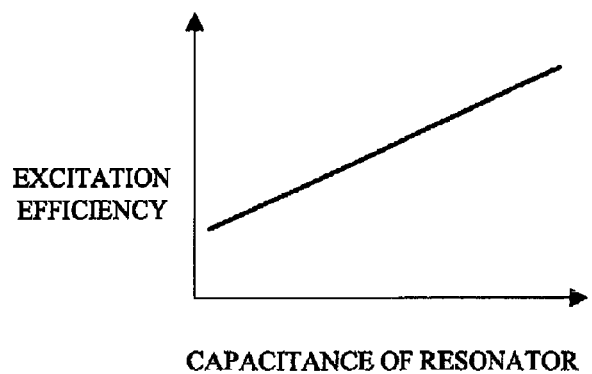
FIG. 26E shows the excitation efficiency with respect to the capacitance of the resonator.

FIG. 26A is a top view of a standard FBAR (resonator 00). FIG. 26B is a configuration thereof. FIG. 26A and FIG. 26B are respectively identical to FIG. 1C and FIG. 1A. The same components and configurations have the same reference numerals and a detailed explanation will be omitted. In FIG. 26A, a membrane region 78 is a region where the upper electrode film 73, the piezoelectric film 74, and the lower electrode film 75 overlap. FIG. 26C is a top view of a resonator (resonator 02) in which two FBARs are connected in parallel. FIG. 26D is a configuration thereof. In the resonator 02, two resonators S23 are connected in parallel, and an area of a membrane region 78a of each resonator S23 is configured to be ½ of the area of the membrane region 78 of the resonator 00. FIG. 26E is a view showing the excitation efficiency with respect to the capacitance of the resonator. As the capacitance becomes greater, the excitation efficiency is increased.

Accordingly, in a similar manner as the resonator 02, it is possible to realize the resonator in which the capacitance is not changed and the excitation efficiency is reduced by connecting two resonators in parallel, each of the resonator having ½ area of the membrane region and ½ capacitance. In this manner, it is possible to realize the resonator in which the excitation efficiency is reduced by connecting "n" resonators in parallel, each of the "n" resonators having 1/n area of the membrane region.

As described above, the excitation efficiency of the second resonator can be reduced more than that of the first resonator, by making the area of the membrane region 78a in the second resonator smaller than that of the membrane region 78 of the first resonator. In addition, the excitation efficiency of the second resonator can be reduced more than that of the first resonator by making the capacitance of the second resonator smaller than that of the first resonator. Further, the excitation efficiency can be reduced by connecting two or more above-described resonators in parallel.

As described heretofore, the configuration examples in which the excitation efficiency is reduced in the piezoelectric thin film resonator have been described. However, the configuration is not limited thereto, if the excitation efficiency is reduced. Arbitrary configuration may be employed. Also, the resonator 01 and the resonator 02 may be combined.

In the duplexers and filters employed in the second through fourteenth embodiments, it is possible to provide the second resonator which excitation efficiency is reduced more than that of the first resonator, by employing the resonators 1 through 11 and the resonators 01 and 02.

Second Exemplary Embodiment

Figure 27A:
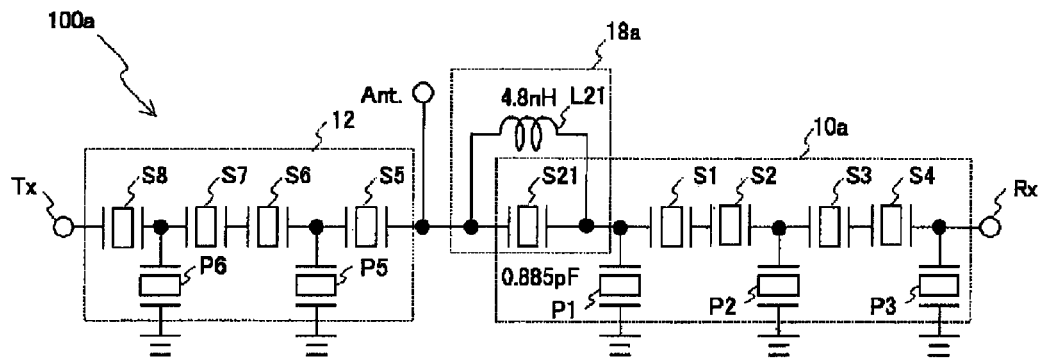
FIG. 27A is a duplexer of Conventional Example 2.
Figure 27B:
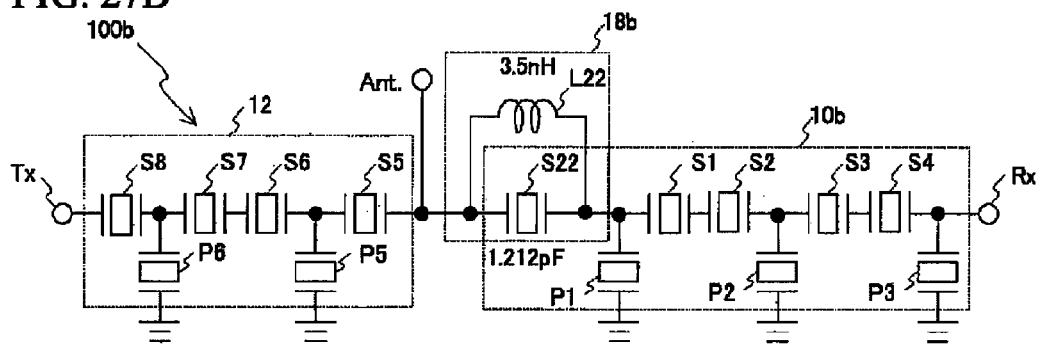
FIG. 27B is a duplexer of Comparative Example 2.
Figure 27C:
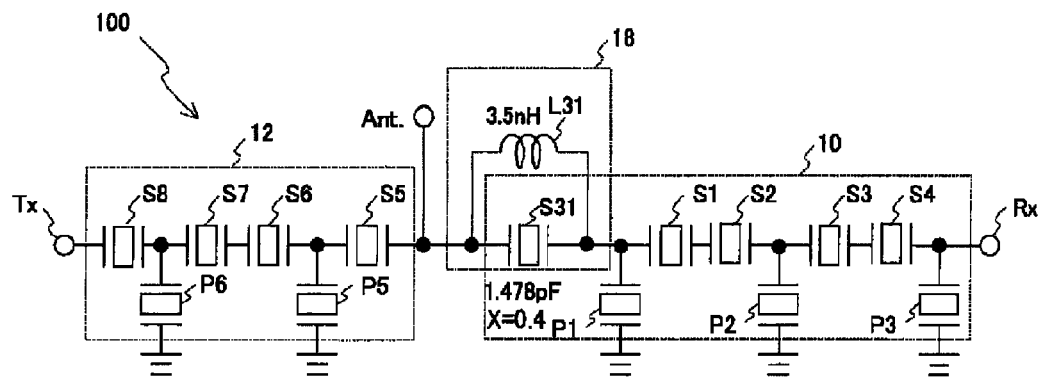
FIG. 27C is a circuit diagram of the duplexer employed in a second exemplary embodiment.

In a second embodiment of the present invention, the resonant circuit employed in the first embodiment is applied to an antenna duplexer. FIG. 27A through FIG. 27C are block diagrams of the duplexer. FIG. 27A is a block diagram of a duplexer 100a of Conventional Example 2 having the resonant circuit 18a of the conventional example 1 shown in FIG. 12A. FIG. 27B is a block diagram of a duplexer 100b of Comparative Example 2 having the resonant circuit 18b of Comparative Example 1. FIG. 27C is a block diagram of a duplexer 100 having the resonant circuit 18 employed in the first exemplary embodiment in accordance with the second exemplary embodiment of the present invention.

Referring to FIG. 27C, the duplexer 100 employed in the second exemplary embodiment includes a receive filter 10 (first filter) connected between an antenna terminal Ant and a receiving terminal Rx. The duplexer 100 also includes a matching circuit composed of the resonant circuit 18 connected between the receive filter 10 and the antenna terminal Ant. The duplexer 100 further includes a transmit filter 12 (second filter) connected between the antenna terminal Ant and a transmitting terminal Tx. The receive filter 10 is a ladder type filter that includes parallel resonators P1 through P3, series resonators S1 through S4, and the series resonator S31. The transmit filter 12 is a ladder type filter that includes parallel resonators P5 and P6 and the series resonators S5 through S8. Here, the resonator S31 functions as a resonator of the matching circuit as well as a resonator of the receive filter 10.

Referring now to FIG. 27A, in the duplexer 100a of Conventional Example 2, except that the resonant circuit 18a of Conventional Example 1 is used for the matching circuit and for a receive filter 10a, the same components and configurations as those of the second embodiment have the same reference numerals and a detailed explanation will be omitted.

Referring to FIG. 27B, in the duplexer 100b of Comparative Example 2, except that the resonant circuit 18b of Comparative Example 2 is used for the matching circuit and for a receive filter 10b, the same components and configurations as those of the second exemplary embodiment have the same reference numerals and a detailed explanation will be omitted.

Figure 28:
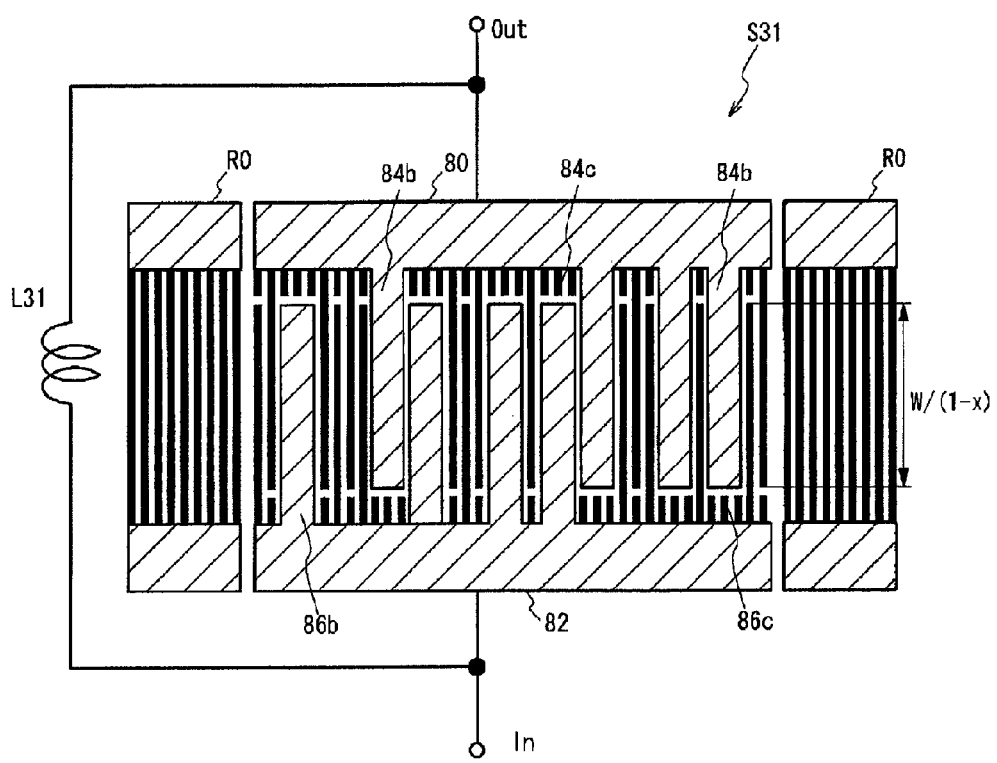
FIG. 28 is a configuration of a resonant circuit in which the excitation efficiency is reduced in the duplexer of Conventional Example 2.

The resonator S21 of Conventional Example 2 is the resonator 0, the resonator S22 of Comparative Example 2 is a resonator in which the aperture length of the resonator 0 of FIG. 14A is multiplied by 1.55. FIG. 28 illustrates a resonant circuit 18 of the duplexer 100 employed in the second exemplary embodiment. The resonator S31 in which the excitation efficiency is reduced and the inductor L31 are connected in parallel between the input terminal In and the output terminal Out. The resonator S31 includes: the electrode fingers 84b and 86b (sheet electrodes) shown in FIG. 17; and dummy electrodes 84c and 86c shown in FIG. 18. There are provided eight electrode fingers 84b and 86b (sheet electrodes). Accordingly, the reduced rate x of the excitation efficiency is 8/20=40%.

FIG. 29A through FIG. 30C are mounting drawings of the duplexers of Conventional Example 2 and Comparative Example 2. FIG. 31 through FIG. 32C are mounting drawings of the duplexer employed in the second exemplary embodiment.

FIG. 31 is a top view of a chip 15 in which the filter employed in the second exemplary embodiment is fabricated. In FIG. 31, lines in black are regions where the metal (aluminum, for example) is formed. The receive filter 10 and the transmit filter 12 are formed on a piezoelectric substrate 14, with the use of the ladder type filter composed of the SAW resonant circuits. In the receive filter 10, the series resonators S31 and the series resonators S1 through S4 are connected in series. The series resonator S4 is connected to the receiving terminal Rx, and the receiving terminal Rx is connected by the parallel resonator P3. The parallel resonator P2 is connected between the series resonators S2 and S3, and the other end of the parallel resonator P3 and the other end of the parallel resonator P2 are connected to a ground terminal Gnd. The parallel resonator P1 is connected between the series resonators S31 and S1, and the other end of the parallel resonator P1 is connected to the ground terminal Gnd. A terminal L is also connected between the series resonators S31 and S1. The other end of the series resonator S31 is connected to the antenna terminal Ant.

In the transmit filter 12, the series resonators S5 through S8 are connected in series. The series resonators S5 through S8 are respectively connected to the antenna terminal Ant and the Tx terminal. The parallel resonator P5 is connected between the series resonators S5 and S6, and the parallel resonator P6 is connected between the series resonators S7 and S8. The other end of the parallel resonator P7 and that of the parallel resonator P8 are connected to the ground terminal Gnd. Au bumps are respectively formed for the terminals Ant, L, Tx, Rx, and Gnd.

FIG. 32C is a cross-sectional view of a package in which the chip used in the second exemplary embodiment is mounted. The chip 15 is flip-chip mounted (in a face-down manner) on a die attach surface 32 of a stacked package 30 with the use of bumps 20. Conductive bump pads 36 that press and bond the bumps are formed on the die attach surface 32. The bump pads 36 are connected to conductive vias 38 embedded. The vias 38 penetrate through the stacked package 30 to a backside 34 thereof, and are coupled to conductive footpads 40 formed on the backside 34. The cavity portion of the stacked package 30 is hermetically sealed by a lid (cap) 31. In this manner, the duplexer 100 is completed.

Figure 32A:
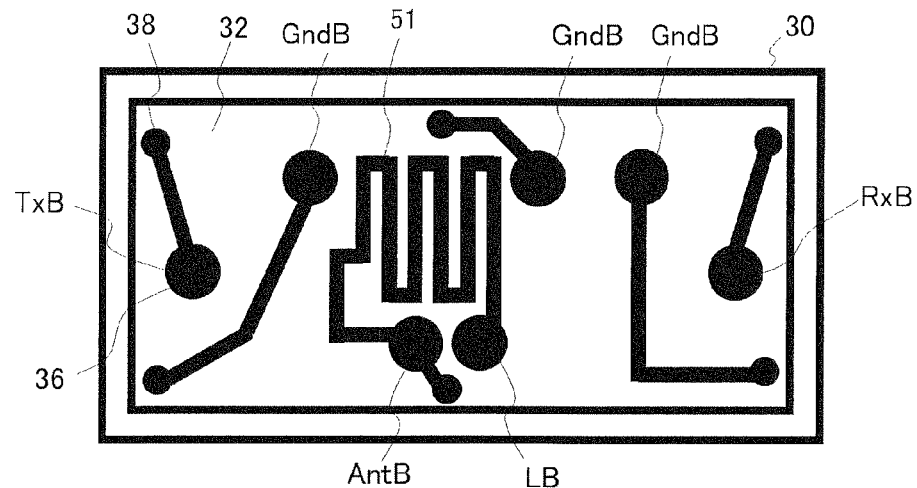
FIG. 32A is a top view of a stacked package before the chip is mounted (before the lid is provided)

FIG. 32A is a top view of the stacked package 30 before the chip 15 is mounted thereon. In FIG. 32A, the regions in black are those where the metal (gold, for example) is provided. One or more bumps 20 formed for the chip 15 are respectively pressed and bonded to one or more bump pads 36, and the chip 15 and the bump pads 36 are electrically coupled. The terminals Ant, L, Tx, Rx, and Gnd are respectively pressed and bonded to bump pads AntB, LB, TxB, RxB, and GndB. An inductor 51 of a line pattern is provided between the bump pads AntB and LB. The inductance of the inductor 51 is 3.5 nH. Accordingly, the inductor 51 is connected in parallel with the resonator S31 formed in the chip. The bump pads AntB, TxB, RxB, and GndB are coupled to the vias 38.

Figure 32B:
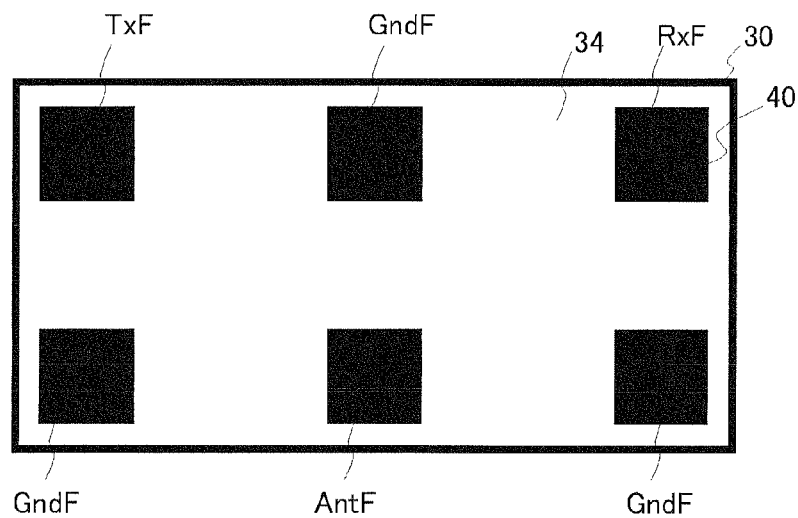
FIG. 32B is a perspective view of the stacked package (before the lid is provided)
Figure 32C:
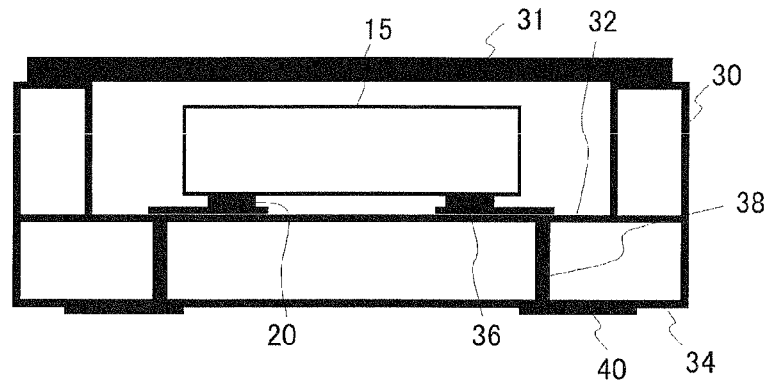
FIG. 32C is a cross-sectional view of the stacked package in which the chip is mounted and the lid is provided.

FIG. 32B is a top perspective view of the backside 34 of the stacked package 30. A footpad 40 is provided on the backside 34. The vias 38 connected to the bump pads AntB, TxB, RxB, and GndB are respectively coupled to the footpads AntF, TxF, RxF, and GndF, and are also coupled to the outside of the stacked package 30. As described heretofore, the inductor 51 is connected in parallel with the resonator S31.

Figure 29A:
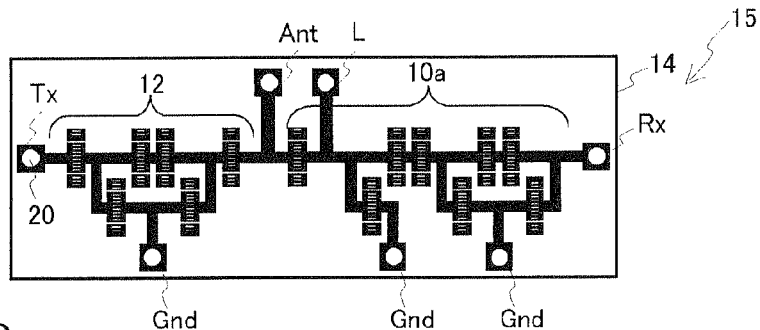
FIG. 29A is a top view of a chip in the duplexer of Conventional Example 2.
Figure 29B:
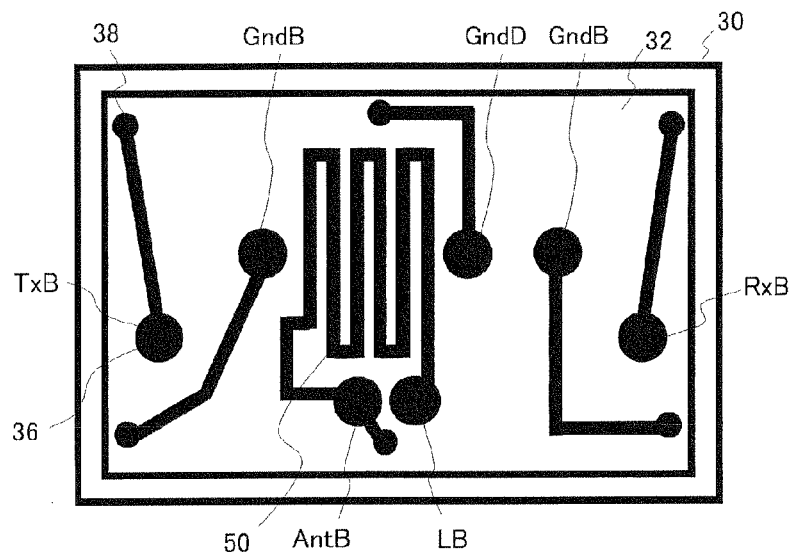
FIG. 29B is a top view of a stacked package before the chip is mounted (before the lid is provided)
Figure 29C:
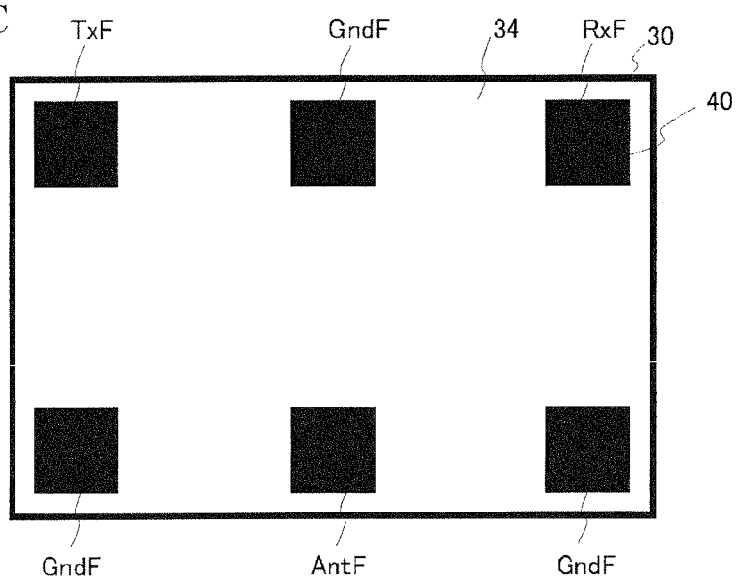
FIG. 29C is a perspective view of the stacked package from the top.

FIG. 29A is a top view of the chip of the duplexer of Conventional Example 2. FIG. 29B is a top view before the chip of the stacked package 30 is mounted. FIG. 29C is a perspective view of the backside 34 of the stacked package 30. In Conventional Example 2, except that the resonator S21 is a resonator in which the excitation efficiency is not reduced, the inductance of an inductor 50 is 4.8 nH, and the inductor area is great, the same components and configurations as those of the second embodiment shown in FIG. 31, FIG. 32A, and FIG. 32B have the same reference numerals and a detailed explanation will be omitted.

Figure 30A:
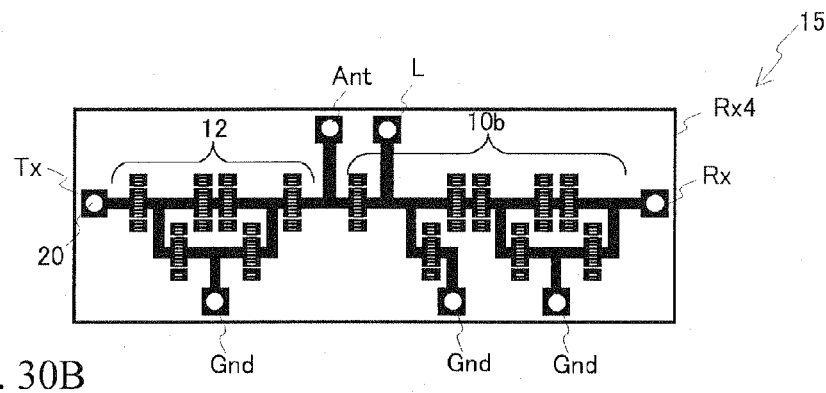
FIG. 30A is a top view of a chip in the duplexer of Comparative Example 2.
Figure 30B:
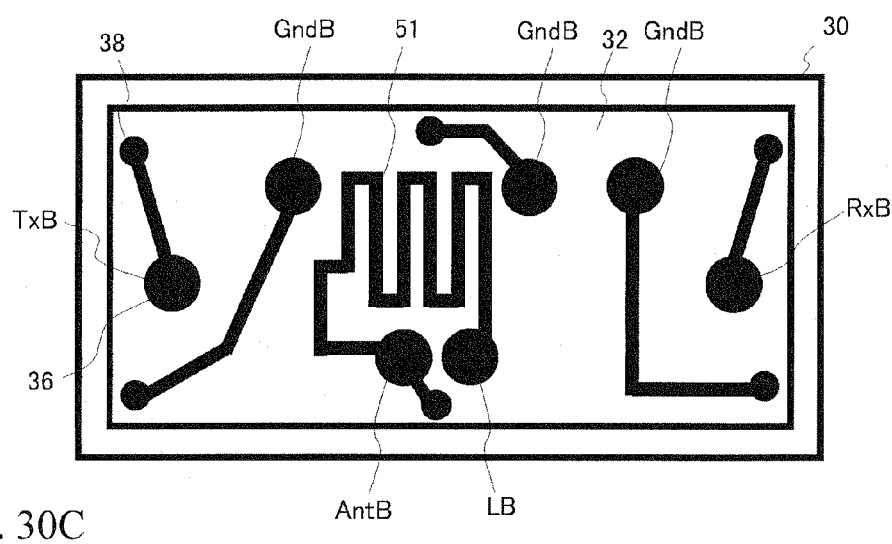
FIG. 30B is a top view of a stacked package before the chip is mounted (before the lid is provided)
Figure 30C:
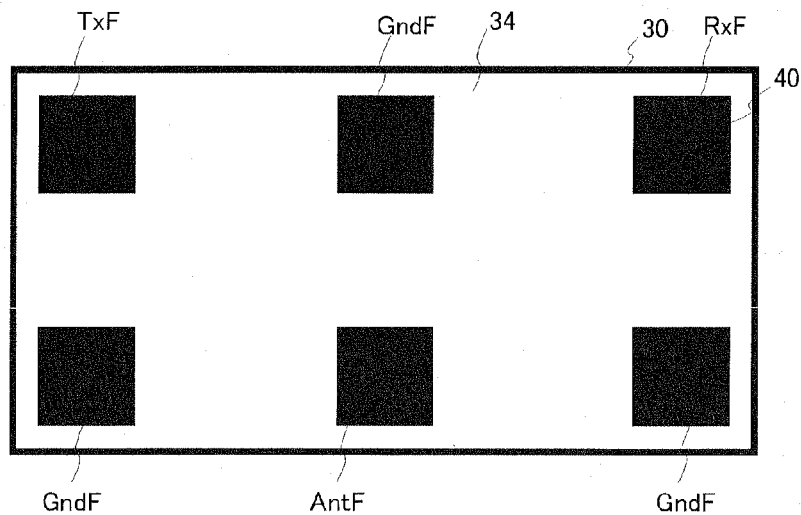
FIG. 30C is a perspective view of the stacked package from the top.
Figure 31:
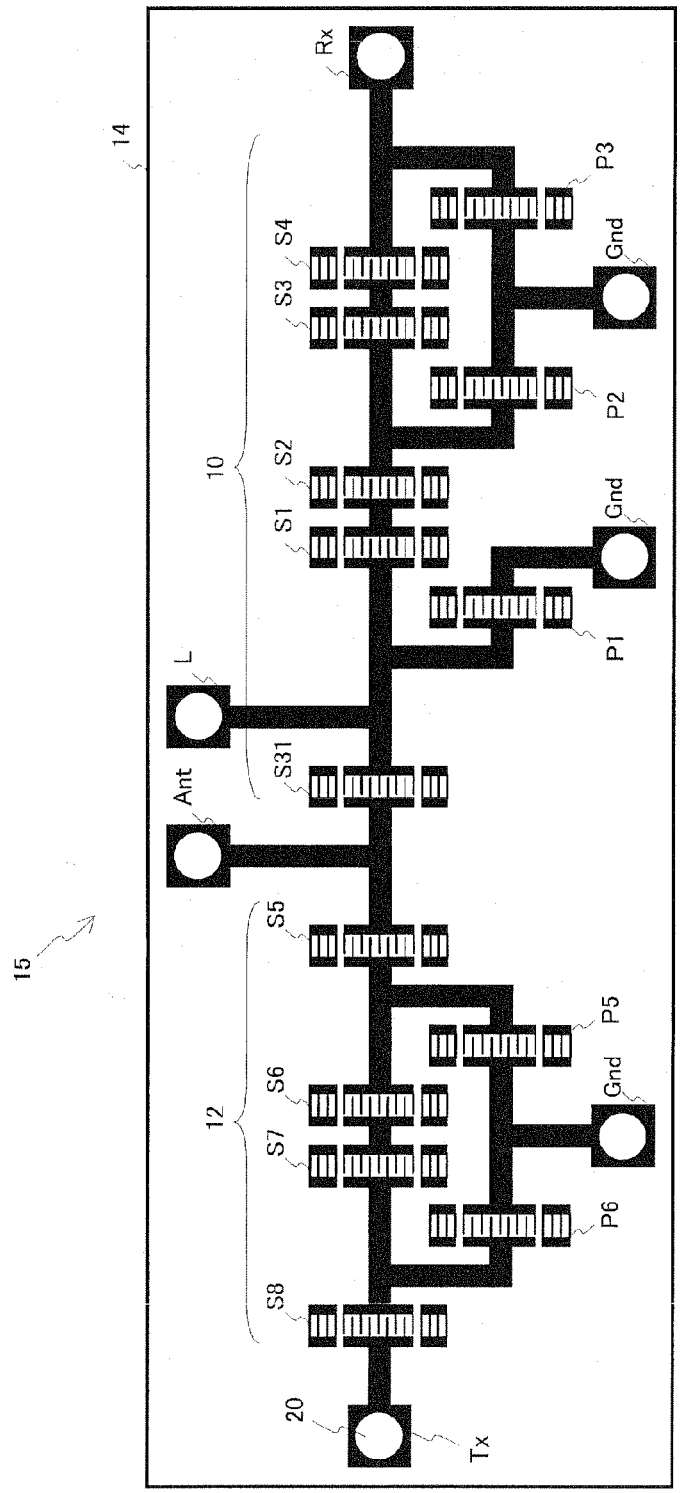
FIG. 31 is a top view of the chip in the duplexer employed in a second exemplary embodiment.

FIG. 30A is a top view of the chip of the duplexer of Comparative Example 2. FIG. 30B is a top view before the chip of the stacked package 30 is mounted. FIG. 30C is a perspective view of the backside 34 of the stacked package 30. In Comparative Example 2, except that the resonator S22 is a resonator in which the excitation efficiency is not reduced, the same components and configurations as those of the second embodiment shown in FIG. 31, FIG. 32A, and FIG. 32B have the same reference numerals.

In the duplexer employed in the second exemplary embodiment and that of Comparative Example 2, the package sizes (mounting area) are made smaller than that of Conventional Example 2. This is because the inductor 50 in Comparative Example 2 and that used in the second embodiment respectively have the inductance of 3.05 nH, which is reduced to approximately 73 percent from 4.8 nH of the inductance of the inductor 50 of Conventional Example 2.

Figure 33A:
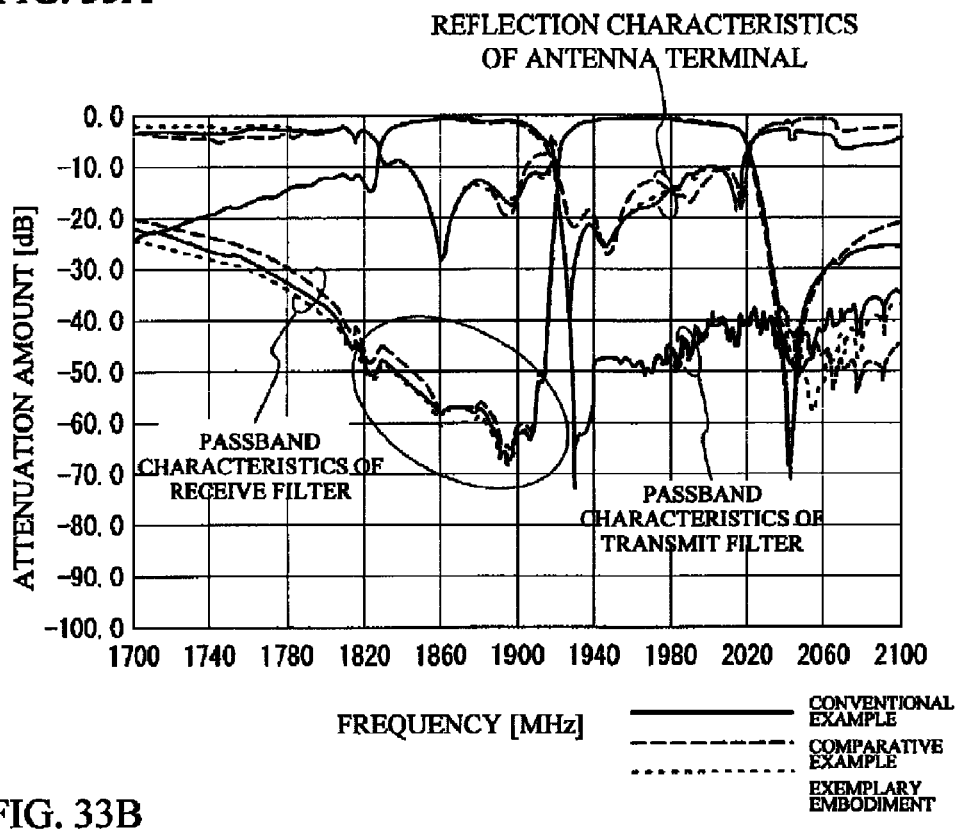
FIG. 33A shows passband characteristics of the receive filter and the transmit filter and the reflection characteristic of the antenna terminal of the duplexer in accordance with Conventional Example 2, Comparative Example 2, and the second embodiment.
Figure 33B:
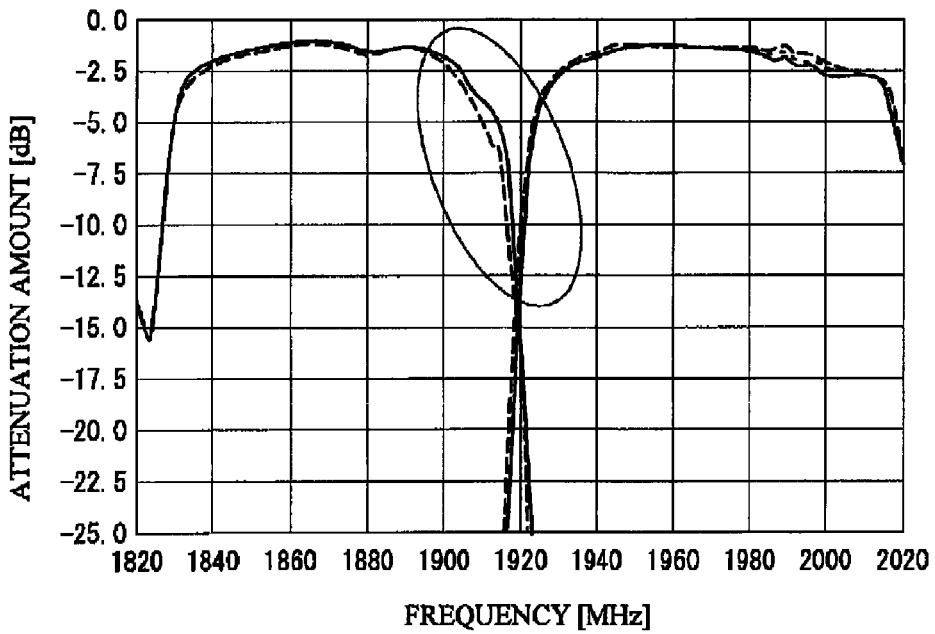
FIG. 33B is an enlarged view around the passband of the passband of the receive filter and the transmit filter.

FIG. 33A shows measurement results of the passband characteristics of the receive filter and the transmit filter and the reflection characteristic of the antenna terminal of the duplexer of Conventional Example 2, of Comparative Example 2, and used in the second exemplary embodiment. FIG. 33B is an enlarged view around the passband of the passband characteristics of the receive filter and the transmit filter. In Comparative Example 2, the attenuation amount of the receive filter is degraded at 1850 MHz to 1910 MHz, which corresponds to the transmission bandwidth (ellipse part in FIG. 33A). This represents that the attenuation amount of the resonant circuit 18b of Comparative Example 1 is poorer than the resonant circuit 18a of Conventional Example 1, as shown in FIG. 13B. In addition, loss of the transmit filter is increased around 1900 MHz to 1910 MHz near a high-frequency edge of the transmission bandwidth (ellipse part in FIG. 33B). This results from the degraded reflection characteristic of the antenna terminal around the above-described passband, as shown in FIG. 33A.

Meanwhile, the passband characteristics of the receive filter and the transmit filter of the duplexer 100 employed in the second exemplary embodiment and the reflection characteristic of the antenna terminal are almost same as those of the duplexer 100*a* of Conventional Example 2. In this manner, as to the duplexer 100 used in the second exemplary embodiment, it is possible to reduce the mounting area of the stacked package 30, while the passband characteristics of the filter are being kept almost the same as that of Conventional Example 2. In addition, the resonant circuit 18 is located on the side of the antenna terminal Ant of the receive filter 10, and the antiresonance point (attenuation pole) is set to the side of the transmission frequency band. That is to say, the resonant circuit 18 is used as a series resonant circuit arranged closet to the antenna terminal Ant of the ladder type filter. This allows the resonant circuit 18 to function as the matching circuit of the duplexer and to improve the attenuation characteristic in the transmission passband of the receive filter 10.

Also, as descried in the second exemplary embodiment, the inductor L31 of the resonant circuit 18 can be composed of a line pattern formed on the stacked package 30 on which the resonator S31 is mounted. Furthermore, the mounting area can be reduced in size by mounting in a face-down manner.

Third Exemplary Embodiment

Figure 34A:
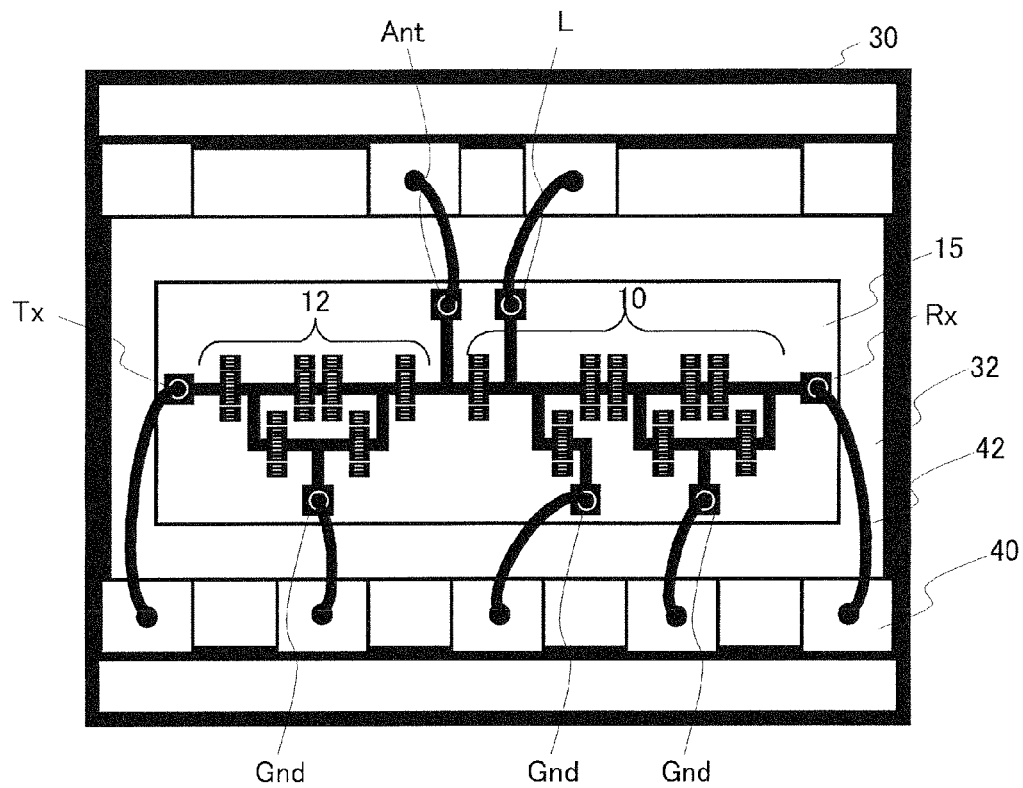
FIG. 34A is a top view of the stacked package in which the chip of the duplexer employed in the third exemplary embodiment is mounted (before the lid is provided)
Figure 34B:
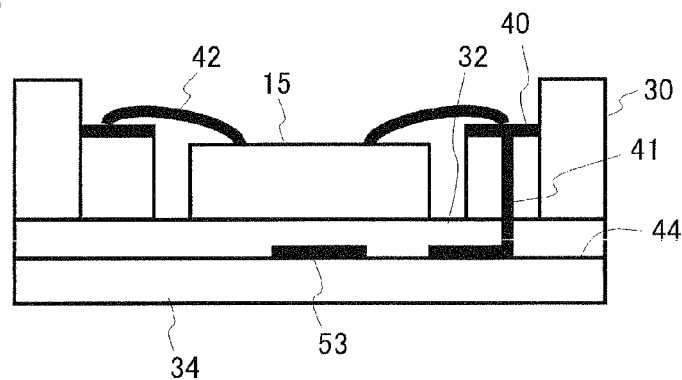
FIG. 34B is a cross-sectional view of the stacked package in which the chip is mounted and the lid is provided.
Figure 35:
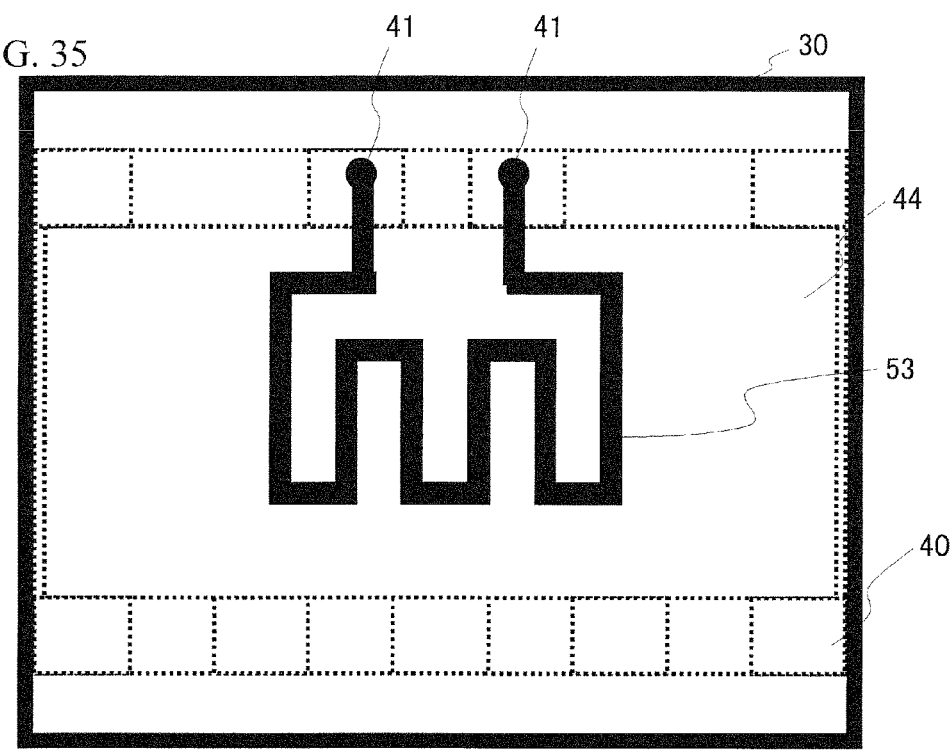
FIG. 35 is a top view of the stacked package of the duplexer employed in a third embodiment of the present invention.

A third exemplary embodiment of the present invention is an example in which an inductor 53 is formed in the stacked package 30 and the chip 15 is mounted in a face-up manner. FIG. 34A is a top view of the stacked package 30 on which the chip 15 is mounted. FIG. 34B is a cross-sectional view of the stacked package 30. FIG. 35 is a top view of a lamination layer 44 of the stacked package 30. In the third exemplary embodiment, the same components and configurations as those of the second embodiment have the same reference numerals and a detailed explanation will be omitted. Referring to FIG. 34A and FIG. 34B, the chip 15 is mounted on the die attach surface 32. In the chip 15, except that no bumps are formed in the terminals Ant, L, Tx, Rx, or Gnd, the same components and configurations as those of the second exemplary embodiment have the same reference numerals. Terminals are respectively connected to the pads 40 of the stacked package 30 by wires 42. In the pads 40 connected by the antenna terminals Ant and L, vias 41 are formed in the stacked package 30, to be coupled to the inductor 53 formed in the lamination layer 44. Referring to FIG. 35, the inductor 53 made of a conductive line pattern is provided on the surface of the lamination layer 44.

In accordance with the third exemplary embodiment, the inductor 53 is connected in parallel with the resonator S31 through the via 41 and the wire 42. As stated, it is possible to mount the chip 15 in a face-up manner.

Fourth Exemplary Embodiment

Figure 36:
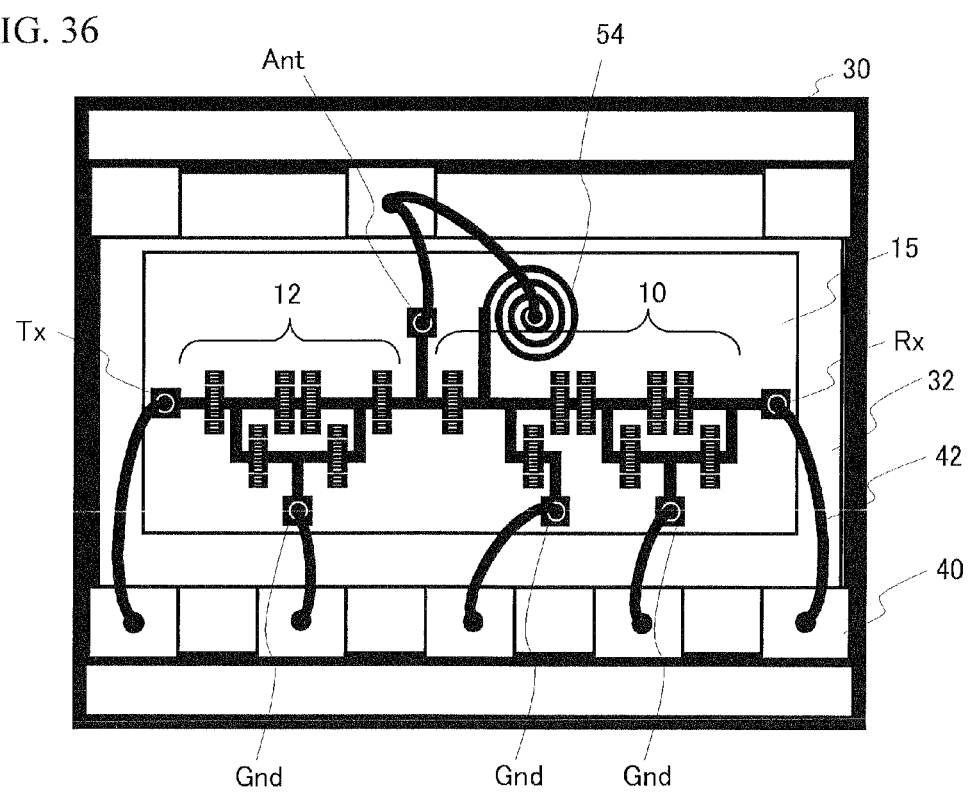
FIG. 36 is a top view of the stacked package in which the chip of the duplexer employed in a fourth exemplary embodiment is mounted (before the lid is provided)

A fourth embodiment of the present invention is an example in which an inductor 54 is formed on the chip, and the chip 15 is mounted in a face-up manner. FIG. 36 is a top view of the stacked package 30 on which the chip 15 is mounted. In the fourth exemplary embodiment, the same components and configurations as those of the third exemplary embodiment have the same reference numerals and a detailed explanation will be omitted. Referring to FIG. 36, the inductor 54 formed of a spiral coil is provided on the chip 15. One end of the inductor 54 is connected between the resonator S31 and S1, and the other end thereof is connected to the pad 40 by a wire 42 from the antenna terminal Ant. Accordingly, the inductor 54 is connected in parallel with the resonator S31 through the wire 42.

In accordance with the fourth exemplary embodiment, it is possible to provide the inductor 131 of the resonant circuit 18 and the receive filter 10 on an identical substrate on which the resonator S31 is provided.

Fifth Exemplary Embodiment

Figure 37:
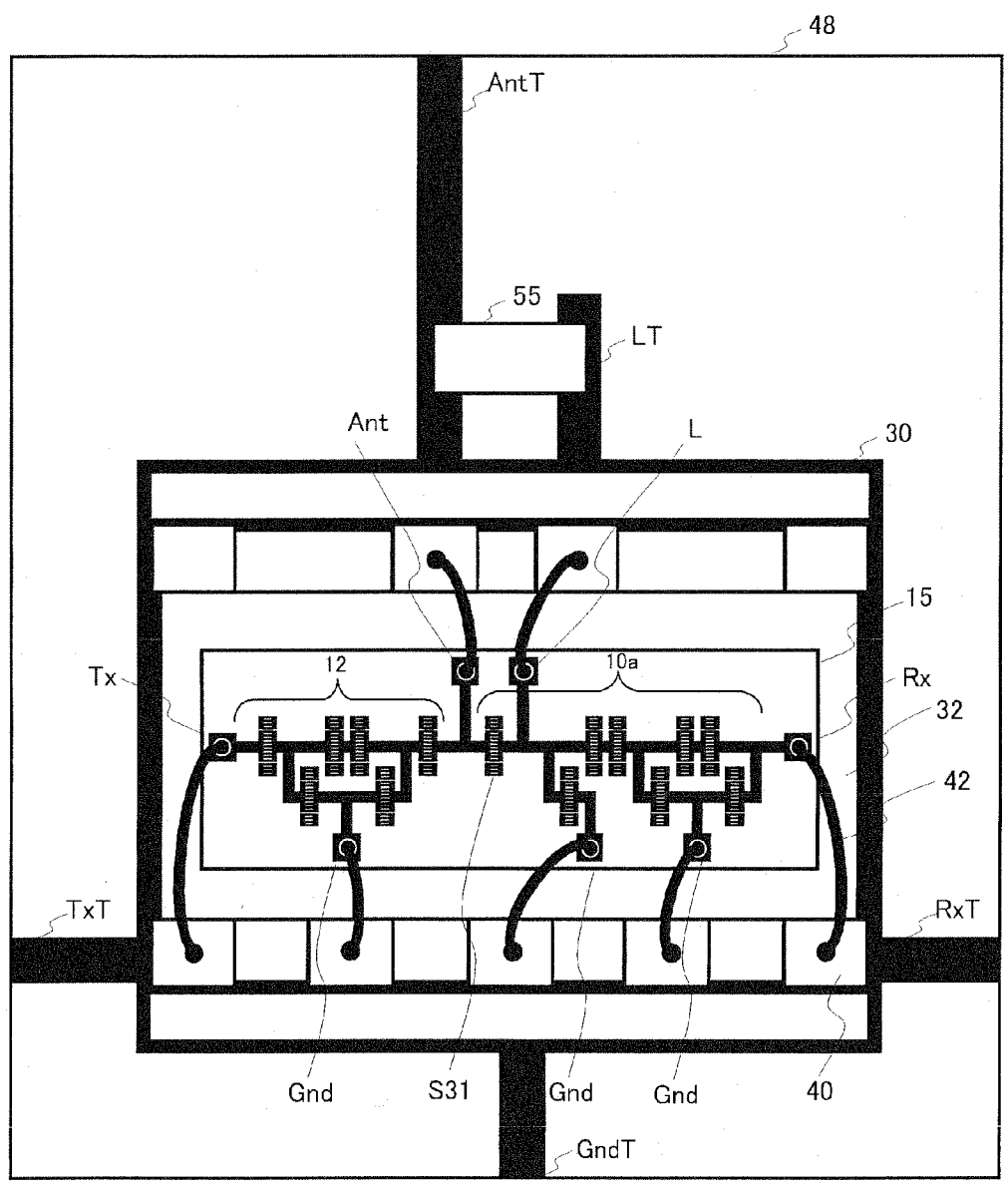
FIG. 37 is a top view of the stacked package in which the chip of the duplexer employed in a fifth exemplary embodiment is mounted and a printed circuit board on which the stacked package is mounted (before the lid is provided)

A fifth exemplary embodiment of the present invention is an example in which a chip inductor 55 is mounted on a printer circuit board on which the stacked package 30 is mounted. FIG. 37 is a top view of the stacked package 30 and a printed circuit board 48. On the stacked package 30, the chip 15 is mounted. In the fifth exemplary embodiment, the same components and configurations as those of the third embodiment have the same reference numerals and a detailed explanation will be omitted. Referring to FIG. 37, no inductor is provided on the chip 15. The terminals Ant, L, Tx, Rx, and Gnd of the chip 15 are respectively connected through the vias and the footpads (not shown) formed in the stacked package 30, to terminals AntT, Lt, TxT, RxT, and GndT of the printed circuit board 48. Then, the chip inductor 55 is connected between the terminals AntT and LT. Accordingly, the chip inductor 55 is connected in parallel with the resonator S31.

Sixth Exemplary Embodiment

Figure 38:
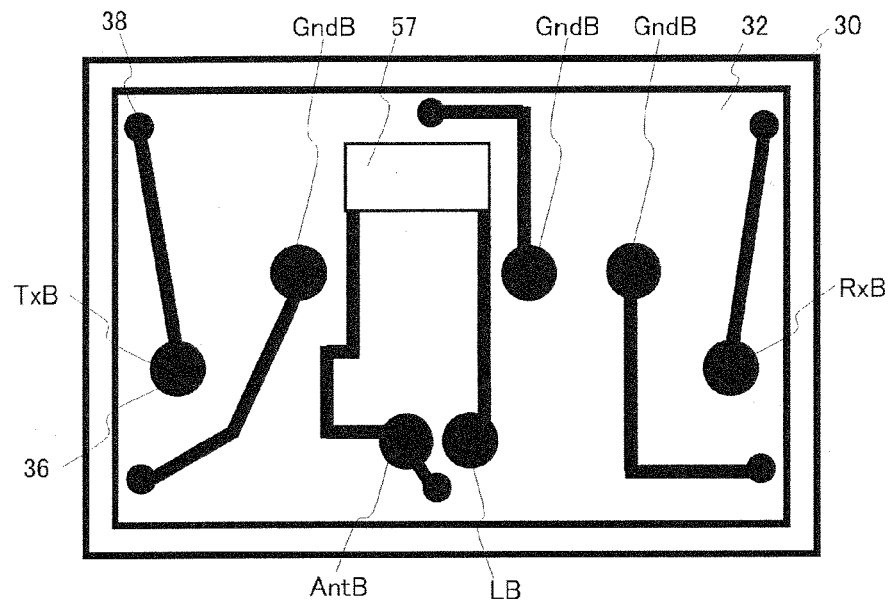
FIG. 38 is a top view of the stacked package in which the chip of the duplexer employed in a sixth exemplary embodiment is mounted (before the lid is provided)

A sixth exemplary embodiment of the present invention is an example in which a chip inductor 57 is mounted on the die attach surface 32 of the stacked package 30. FIG. 38 is a top view of the stacked package 30 of the duplexer employed in the sixth exemplary embodiment before the chip is mounted. The chip inductor 57 is mounted instead of the inductor 57 made of a line pattern formed on the die attach surface 32 employed in the second exemplary embodiment. Then, the chip inductor 57 is connected in parallel with the resonator S31. Other configurations are same as those employed in the second exemplary embodiment, and the same components and configurations as those employed in the second exemplary embodiment have the same reference numerals and a detailed explanation will be omitted.

As in the fifth exemplary embodiment, the inductor L31 of the resonant circuit 18 and the receive filter 10 may be composed of the chip inductor 51 provided on the printed circuit board 48 (substrate) outside of the stacked package 30 on which the resonator S31 is mounted. Also, as in the sixth embodiment, the inductor L31 of the resonant circuit 18 and the receive filter 10 may be composed of the chip inductor 57 provided in the stacked package 30.

Seventh Exemplary Embodiment

Figure 39:
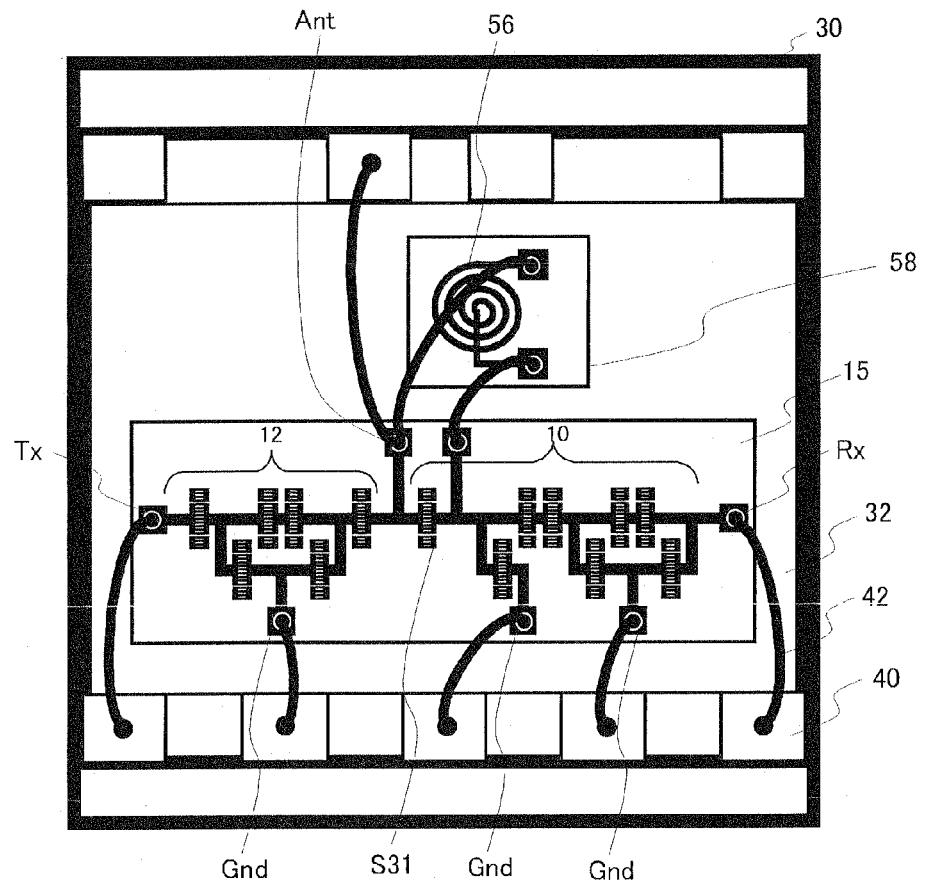
FIG. 39 is a top view of the stacked package in which the chip of the duplexer and an IPD chip employed in a seventh exemplary embodiment are mounted (before the lid is provided)

A seventh exemplary embodiment of the present invention is an example in which an inductor 56 is mounted on an integrated passive device (IPD) chip 58. FIG. 39 is a top view of the stacked package 30 on which the chip 15 and the IPD chip 58 are mounted. In the seventh exemplary embodiment, the same components and configurations as those of the third exemplary embodiment have the same reference numerals and a detailed explanation will be omitted. Referring to FIG. 39, no inductor is provided on the chip 15. On the IPD chip 58, the inductor 56 that employs a spiral coil is provided. The chip 15 and the IPD chip 58 are connected by the wire 42. Accordingly, the inductor 56 is connected in parallel with the resonator S31.

In accordance with the seventh exemplary embodiment, the inductor L31 of the resonant circuit 18 and the receive filter 10 may be an inductor provided on the IPD chip 58 (substrate) other than the piezoelectric substrate 14 on which the resonator S31 is provided.

In accordance with the third through seventh exemplary embodiments, in the resonant circuit 18 and the duplexer 100, the mounting area of the package 30 can be reduced while the passband characteristics of the filter is kept almost the same as those of Conventional Example, in a similar manner as the first and second exemplary embodiments.

Eighth Exemplary Embodiment

Figure 40:
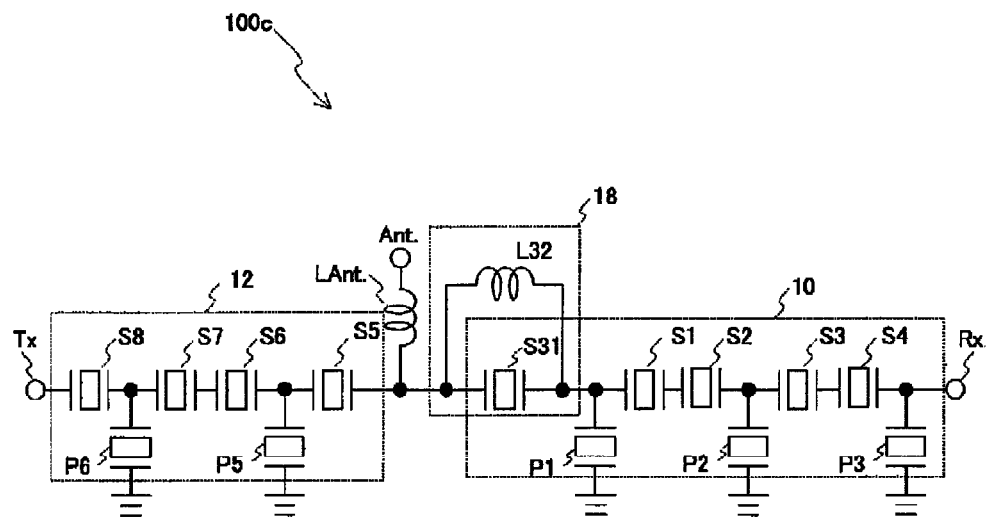
FIG. 40 is a circuit diagram of the duplexer employed in an eighth exemplary embodiment.

FIG. 40 is a block diagram of a duplexer 100c in accordance with an eighth exemplary embodiment of the present invention. In the duplexer 100c, a matching inductor LAnt is connected in series with the antenna terminal Ant. Except the afore-described configuration, the same components and configurations as those of the second embodiment have the same reference numerals and a detailed explanation will be omitted. In accordance with the eighth exemplary embodiment, it is possible to reduce the reflection loss of the antenna terminal.

Ninth Exemplary Embodiment

Figure 41:
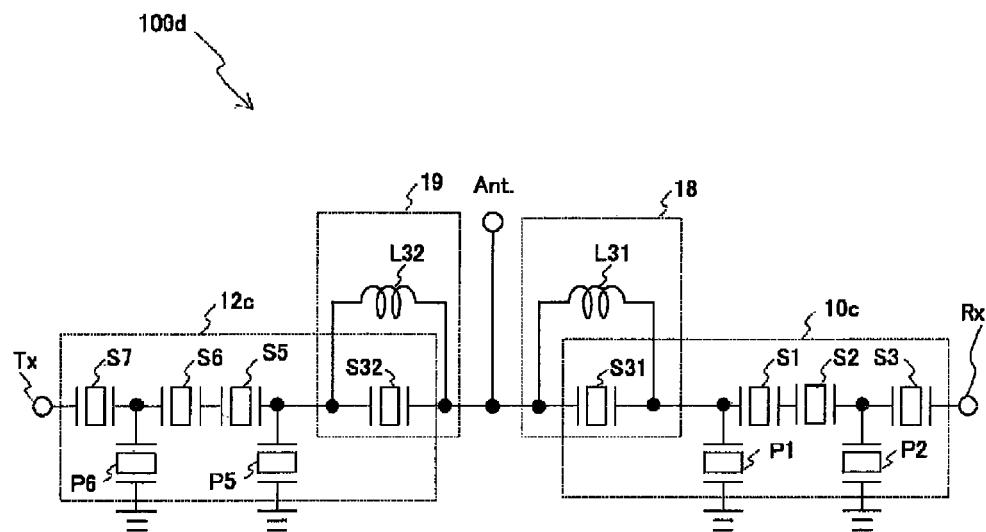
FIG. 41 is a circuit diagram of the duplexer employed in a ninth exemplary embodiment.

FIG. 41 is a block diagram of a duplexer 100d in accordance with a ninth exemplary embodiment of the present invention. In the duplexer 100d, the resonant circuit 18 is provided on the side of the antenna terminal Ant of a receive filter 10c, and in addition, a resonant circuit 19 is provided on the side of antenna terminal Ant of a transmit filter 12c. In the resonant circuit 19, an inductor 132 is connected in parallel with a resonator S32 which excitation efficiency is reduced. Except the afore-described configuration, the same components and configurations as those of the second exemplary embodiment have the same reference numerals and a detailed explanation will be omitted. The resonant circuit 19 is configured such that there is the antiresonance point (attenuation pole) in the receive bandwidth. Accordingly, the resonant circuit 19 functions as a matching circuit of the duplexer, and may be used to improve the attenuation characteristic in the receive bandwidth of the receive filter 12c. It is therefore possible to increase the impedance of the receive bandwidth when viewed from the antenna of the transmit filter 12c, and increase the impedance of the transmit bandwidth when viewed from the antenna of the receive filter 10c. This can realize a low-loss duplexer.

Tenth Exemplary Embodiment

Figure 42:
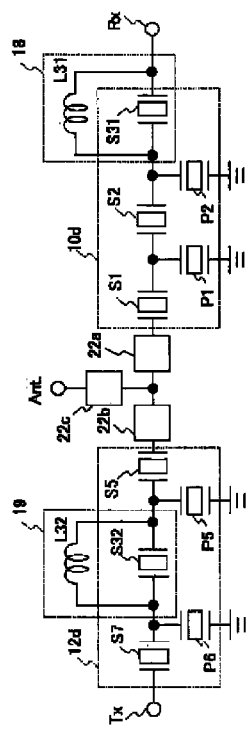
FIG. 42 is a circuit diagram of the duplexer employed in a tenth exemplary embodiment.

FIG. 42 is a block diagram of a duplexer 100e in accordance with a tenth exemplary embodiment of the present invention. In the duplexer 100e, no inductor is provided to the resonator on the side of the antenna terminal Ant of a receive filter 10d or that of a transmit filter 12d. The resonant circuit 18 is located on the side of the receiving terminal Rx of the receive filter 10d, and the resonant circuit 19 is located in the middle of the receive filter 10d. In addition, matching circuits 22a, 22b, and 22c are respectively connected in series between the transmit filter 12d and the antenna terminal Ant, between the transmit filter 12d and the antenna terminal Ant, and with the antenna terminal Ant. The matching circuits 22a through 22c are designed with the use of a lumped parameter circuit having an inductor or capacitor, or a distributed constant circuit having a strip line or micro strip line. In accordance with the tenth exemplary embodiment, it is possible to set the antiresonance point (attenuation pole) separately from the demand for the matching circuit, by connecting the inductor in parallel with the series resonator with the use of the resonator in which the excitation efficiency is reduced, instead of the series resonator provided on the side of the antenna terminal Ant. Accordingly, it is possible to improve the attenuation amount of an arbitrary frequency. In addition, the inductors L31 and L32 can be reduced in size, thereby decreasing the mounting surface.

In accordance with the eighth through tenth exemplary embodiments, at least one of the transmit filter (second filter) and the receive filter (first filter) is configured to include the first resonator, the second resonator S31 in which the excitation efficiency is reduced more than the first resonator, and the inductor L31 connected in parallel with the resonator S31, thereby making it possible to provide an antenna duplexer in which the mounting area is reduced and the attenuation amount can be improved at an arbitrary frequency.

Eleventh Exemplary Embodiment

Figure 43:
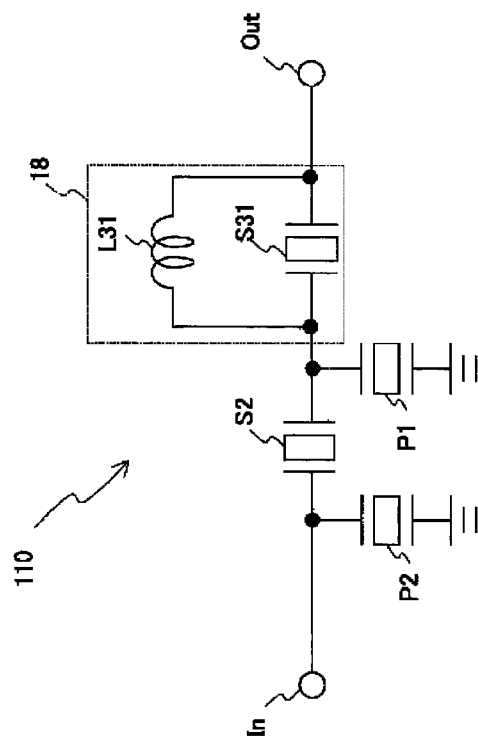
FIG. 43 is a circuit diagram of a ladder type filter employed in an eleventh exemplary embodiment.

FIG. 43 is a block diagram of a ladder type filter 110 in accordance with an eleventh exemplary embodiment of the present invention. In the ladder type filter 110, series resonators S2 and S31 and parallel resonators P1 and P2 are provided between the input terminal In and the output terminal Out. The resonant circuit 18 is employed for the series resonator on the side of the output terminal Out. In the resonant circuit 18, the inductor L31 is connected in parallel with the resonator S31 in which the excitation efficiency is reduced. It is possible to improve the attenuation amount at an arbitrary frequency to a large degree by including the resonant circuit 18 employed in the first exemplary embodiment.

Twelfth Exemplary Embodiment

Figure 44:
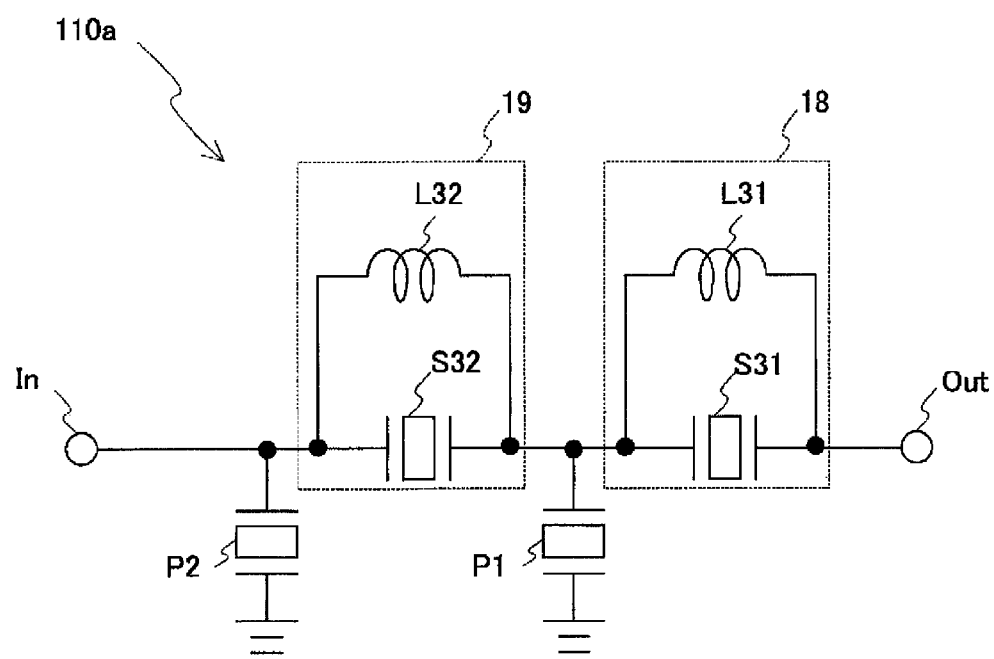
FIG. 44 is a circuit diagram of a ladder type filter employed in a twelfth exemplary embodiment.

FIG. 44 is a block diagram of a ladder type filter 110a in accordance with a twelfth exemplary embodiment of the present invention. In the ladder type filter 110a, in addition to the resonant circuit 18 employed in the tenth exemplary embodiment, the inductor L32 is connected with a remaining series resonator S32 with the use of the resonator in which the excitation efficiency is reduced. The resonator S32 and the inductor L32 compose the resonant circuit 19 employed in the first exemplary embodiment. Accordingly, in the ladder type filter 110a, the inductor is connected with all the series resonators, with the use of the resonator in which the excitation efficiency is reduced. It is therefore possible to improve the attenuation amount at an arbitrary frequency, as compared to the filter 110 employed in the eleventh exemplary embodiment.

In accordance with the eleventh and twelfth embodiments, in the ladder type filter, at least one of the series resonant circuits includes the second resonator in which an inductor is connected in parallel and the excitation efficiency is reduced more than another resonator (first resonator). This makes it possible to reduce the mounting area and improve the attenuation amount at an arbitrary frequency.

Further, in the second through twelfth embodiments, a description has been given of examples of the resonant circuit 18, which is applied to the series resonant circuit of the ladder type filter, the resonant circuit 18 having the second resonator in which the inductor is connected in parallel with the series resonator of the ladder type filter. However, the resonant circuit 18 used in the first exemplary embodiment may be applied to the parallel resonant circuit. That is to say, it is only necessary that at least one of the series resonant circuit and the parallel resonant circuit is the resonant circuit used in the first exemplary embodiment.

Thirteenth Exemplary Embodiment

Figure 45A:
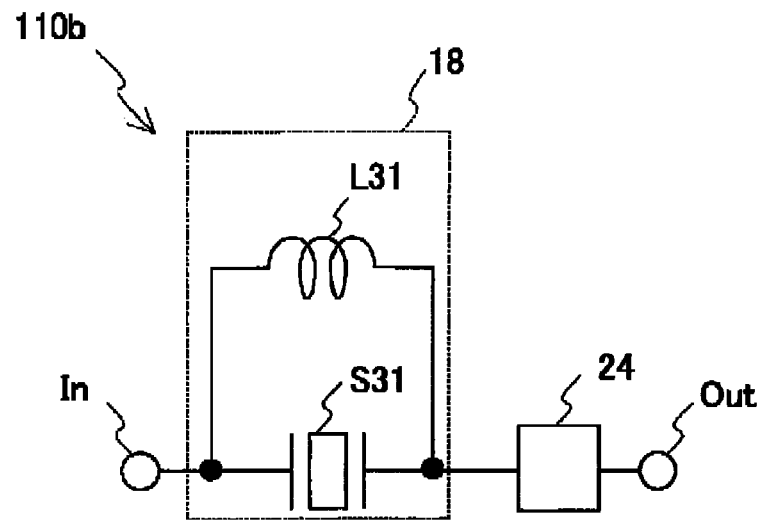
FIG. 45A is a circuit diagram of the filter employed in a thirteenth exemplary embodiment.
Figure 45B:
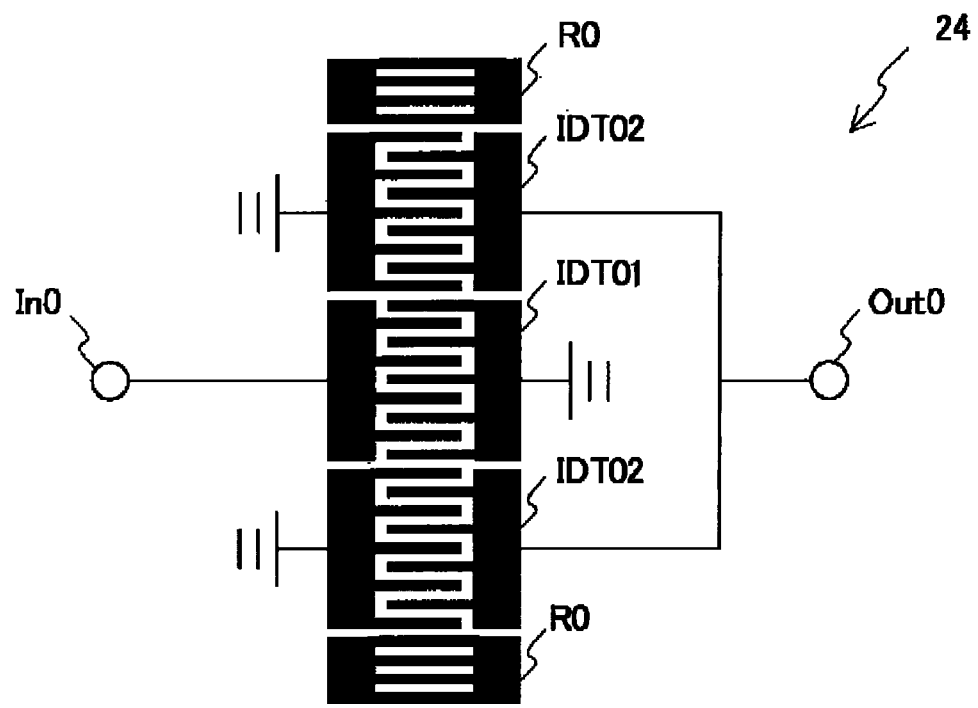
FIG. 45B is a top view of a double-mode SAW filter.

FIG. 45A is a block diagram of a filter 110b in accordance with a thirteenth exemplary embodiment of the present invention. In the filter 110b, a double-mode SAW (DMS) filter 24 is provided between the input terminal In and the output terminal Out, and the resonant circuit 18 used in the first exemplary embodiment is connected in series on the side of the input terminal In of the filter 24. FIG. 45B is a block diagram of the DMS filter 24. The DMS filter 24 includes: two output IDTs 02 connected between the two reflectors R0 and connected to an output terminal Out0; and one input IDT1 connected to an input terminal In0. In this manner, the resonant circuit 18 used in the first exemplary embodiment can be added to a multi-mode SAW filter. It is therefore possible to improve the attenuation amount at an arbitrary frequency in the multi-mode SAW filter.

Fourteenth Exemplary Embodiment

Figure 46:
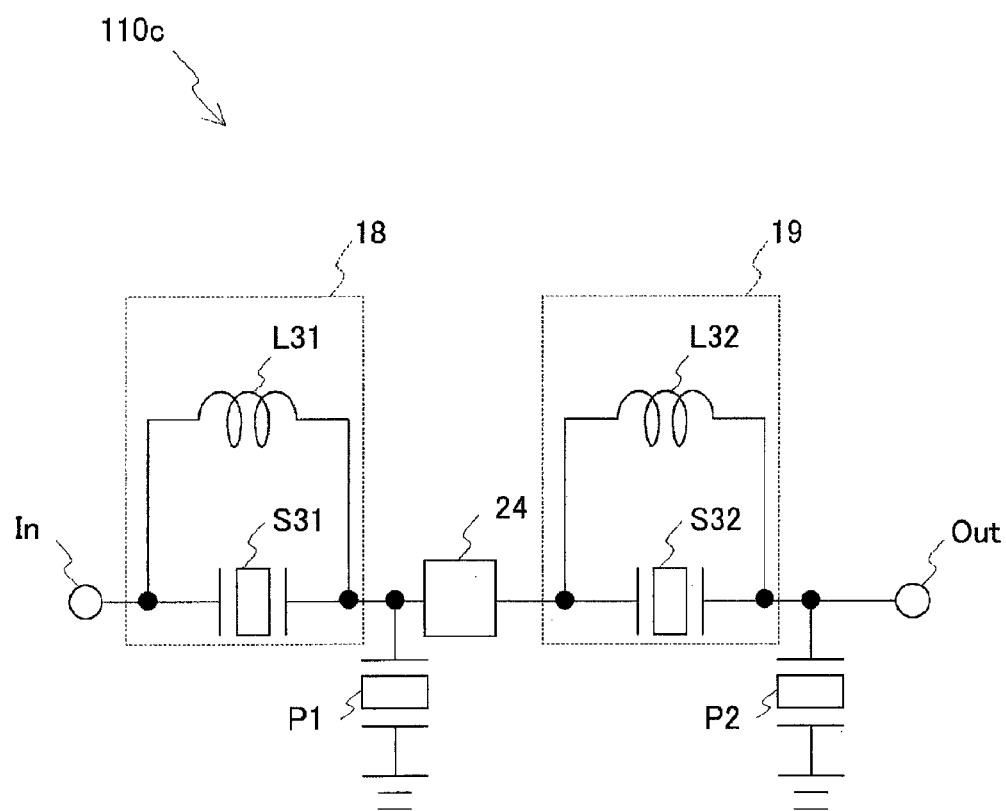
FIG. 46 is a circuit diagram of the filter employed in a fourteenth exemplary embodiment.

FIG. 46 is a block diagram of a filter 110c in accordance with a fourteenth exemplary embodiment of the present invention. In the filter 110c, the resonant circuits 18 and 19 used in the first exemplary embodiment are connected in series at both sides of the DMS filter 24 used in the thirteenth exemplary embodiment. The resonator P1 is connected in parallel between the resonant circuit 18 and the DMS filter 24, and the resonator P2 is connected in parallel with the output terminal Out. In the multi-mode SAW filter with such configuration, the attenuation amount can be improved at an arbitrary frequency.

Fifteenth Exemplary Embodiment

Figure 47A:
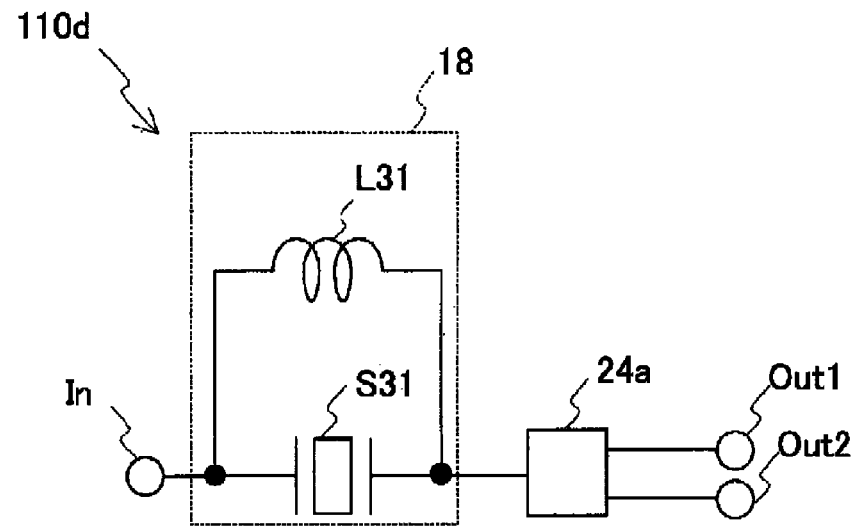
FIG. 47A is a circuit diagram of the filter employed in a fifteenth exemplary embodiment.
Figure 47B:
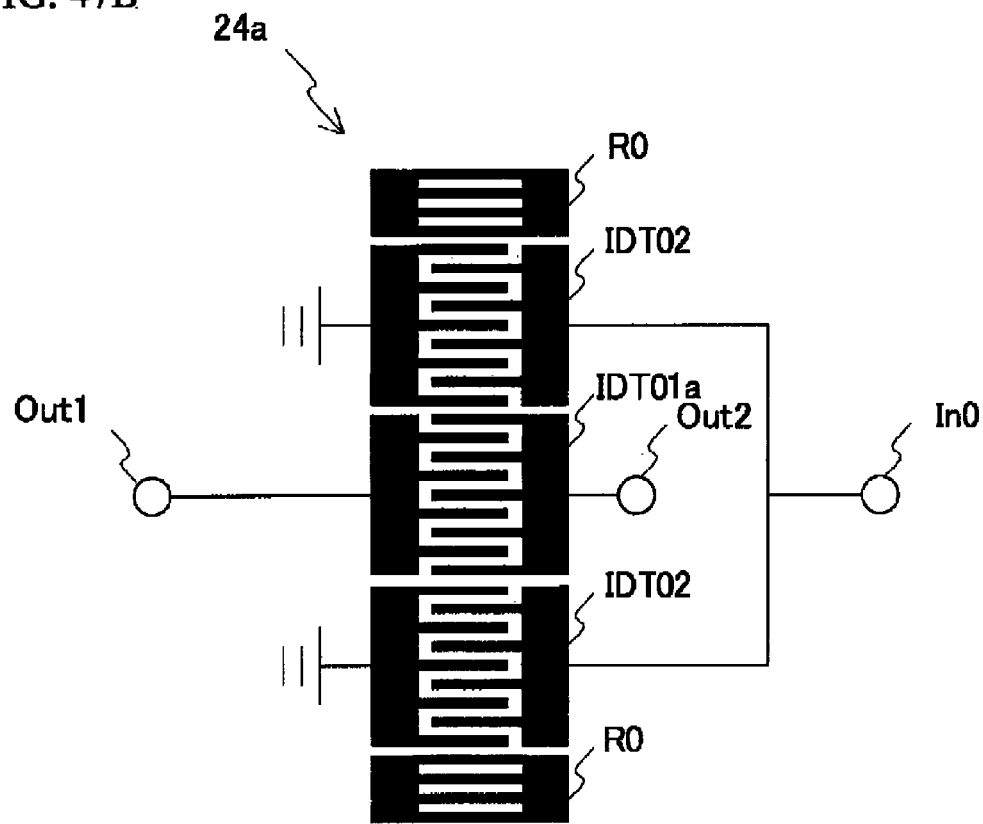
FIG. 47B is a top view of a balance type SAW filter.

FIG. 47A is a block diagram of a filter 110d in accordance with a sixteenth embodiment of the present invention. In the filter 110d, the resonant circuits 18 and 19 employed in the first exemplary embodiment are connected in series at both sides of the input terminal In of a balance type DMS filter 24a connected to output terminals Out1 and Out2. FIG. 47B is a block diagram of the balance type DMS filter 24a. The DMS filter 24a includes: an output IDT 01a provided between the two reflectors R0 and connected to output terminals Out1 and Out2; and two output IDTs 02 connected to the input terminal In0. Phase-inverted signals are output at output terminals Out1 and Out2, so as to serve as a balance type DMS filter. In the balance type multi-mode SAW filter with such configuration, the attenuation amount can be improved at an arbitrary frequency.

In accordance with the filters employed in the fourteenth and fifteenth exemplary embodiments, it is possible to provide a multi-mode SAW filter in which the mounting area can be reduced and the attenuation amount can be improved at an arbitrary frequency, by including the second resonator in which the multi-mode SAW filter and the resonant circuit 18 employed in the first embodiment are connected in parallel.

The filters employed in the eleventh through fifteenth embodiments respectively include: the first resonator; the second resonators S31 and S32 in which the excitation efficiency is reduced more than the first resonator; and the inductors L31 and L32 connected in parallel with the second resonators S31 and S32. It is therefore possible to provide a filter that can be downsized and that can improve the design flexibility.

In the second through thirteenth embodiments, a description has been given of an example in which the SAW resonator is used for the first and second resonators. However, a piezoelectric thin-film resonator may be employed. In such a case, it is possible to obtain the same effects as those in the first through twelfth embodiments.

The present invention is not limited to the above-mentioned exemplary embodiments, and other embodiments, variations and modifications may be made without departing from the scope of the present invention.

The present invention is based on Japanese Patent Application No. 2005-244644 filed on Aug. 25, 2005, the entire disclosure of which is hereby incorporated by reference.

What is claimed is:

1. A ladder type filter comprising:
   series resonators;
   one or more parallel resonators;
   a first resonator;
   a second resonator in which an excitation efficiency is reduced more than the first resonator; and
   an inductor connected in parallel with the second resonator,
   wherein no inductor is connected in parallel with the first resonator,
   at least one of the series resonators is the second resonator, and the other of the series resonators and the one or more parallel resonators are the first resonator;
   the second resonator and the inductor exhibit a resonance point, a first antiresonance point located at a frequency lower than the resonance point, and a second antiresonance point located at a frequency higher than the resonance point; and
   the first antiresonance point and the second antiresonance point are set between a third antiresonance point and a fourth antiresonance point, where the third and fourth antiresonance points are defined as a would-be first antiresonance point and a would-be second antiresonance point of the second resonator and the inductor if the excitation efficiency of the second resonator were the same as that of the first resonator.

2. A surface acoustic wave filter comprising:
   a multi-mode surface acoustic wave filter;
   a first resonator included in the multi-mode surface acoustic wave filter;
   a second resonator in which an excitation efficiency is reduced more than the first resonator; and
   an inductor connected in parallel with the second resonator,
   wherein no inductor is connected in parallel with the first resonator;
   the second resonator and the inductor exhibit a resonance point, a first antiresonance point located at a frequency lower than the resonance point, and a second antiresonance point located at a frequency higher than the resonance point; and
   the first antiresonance point and the second antiresonance point are set between a third antiresonance point and a fourth antiresonance point, where the third and fourth antiresonance points are defined as a would-be first antiresonance point and a would-be second antiresonance point of the second resonator and the inductor if the excitation efficiency of the second resonator were the same as that of the first resonator.

3. An antenna duplexer comprising:

an antenna terminal;

a first filter and a second filter connected to the antenna terminal, wherein at least one of the first filter and the second filter is a ladder type filter including:

series resonators;

one or more parallel resonators;

a first resonator;

a second resonator in which an excitation efficiency is reduced more than the first resonator; and an inductor connected in parallel with the second resonator, wherein no inductor is connected in parallel with the first resonator, at least one of the series resonators is the second resonator, and the other of the series resonators and the one or more parallel resonators are the first resonator;

the second resonator and the inductor exhibit a resonance point, a first antiresonance point located at a frequency lower than the resonance point, and a second antiresonance point located at a frequency higher than the resonance point; and the first antiresonance point and the second antiresonance point are set between a third antiresonance point and a fourth antiresonance point, where the third and fourth antiresonance points are defined as a would-be first antiresonance point and a would-be second antiresonance point of the second resonator and the inductor if the excitation efficiency of the second resonator were the same as that of the first resonator.

* * * * *